(12) United States Patent
Carley et al.

(10) Patent No.: US 9,077,344 B2
(45) Date of Patent: Jul. 7, 2015

(54) SUBSTRATE FOR ELECTRICAL COMPONENT AND METHOD

(75) Inventors: Carl Carley, Fareham (GB); David Brent Guard, Southampton (GB)

(73) Assignee: Atmel Corporation, San Jose, CA (US)

( * ) Notice: Subject to any disclaimer, the term of this patent is extended or adjusted under 35 U.S.C. 154(b) by 326 days.

(21) Appl. No.: 12/962,270

(22) Filed: Dec. 7, 2010

(65) Prior Publication Data

US 2012/0138352 A1 Jun. 7, 2012

(51) Int. Cl.
| | |
|---|---|
| *H05K 1/11* | (2006.01) |
| *H03K 17/96* | (2006.01) |
| *G06F 3/044* | (2006.01) |

(52) U.S. Cl.
CPC ......... *H03K 17/962* (2013.01); *Y10T 156/1002* (2015.01); *G06F 3/044* (2013.01); *H03K 2017/9602* (2013.01); *H03K 2217/96046* (2013.01)

(58) Field of Classification Search
USPC ........... 174/264, 263; 428/137, 157; 429/210; 438/622; 527/687
See application file for complete search history.

(56) References Cited

U.S. PATENT DOCUMENTS

| | | | | |
|---|---|---|---|---|
| 4,383,363 | A * | 5/1983 | Hayakawa et al. | 29/847 |
| 4,967,314 | A * | 10/1990 | Higgins, III | 361/792 |
| 5,117,069 | A * | 5/1992 | Higgins, III | 174/261 |
| 5,638,598 | A * | 6/1997 | Nakaso et al. | 29/852 |
| 5,972,482 | A * | 10/1999 | Hatakeyama et al. | 428/209 |
| 6,009,620 | A * | 1/2000 | Bhatt et al. | 29/852 |
| 6,211,487 | B1 * | 4/2001 | Hatakeyama et al. | 219/121.71 |
| 6,326,694 | B1 * | 12/2001 | Hatakeyama et al. | 257/774 |
| 6,337,037 | B1 * | 1/2002 | St. John | 252/514 |
| 6,534,723 | B1 * | 3/2003 | Asai et al. | 174/255 |
| 6,555,762 | B2 * | 4/2003 | Appelt et al. | 174/264 |
| 6,570,102 | B2 * | 5/2003 | Miller et al. | 174/261 |
| 6,584,682 | B2 * | 7/2003 | Belke et al. | 29/831 |
| 6,889,433 | B1 * | 5/2005 | Enomoto et al. | 29/852 |
| 7,663,607 | B2 | 2/2010 | Hotelling | |
| 7,772,118 | B2 * | 8/2010 | Yamano | 438/667 |
| 7,864,503 | B2 | 1/2011 | Chang | |
| 7,874,066 | B2 * | 1/2011 | Hiroshi et al. | 29/831 |
| 7,875,814 | B2 | 1/2011 | Chen | |
| 7,920,129 | B2 | 4/2011 | Hotelling | |
| 8,031,094 | B2 | 10/2011 | Hotelling | |
| 8,031,174 | B2 | 10/2011 | Hamblin | |
| 8,040,326 | B2 | 10/2011 | Hotelling | |
| 8,049,732 | B2 | 11/2011 | Hotelling | |
| 8,179,381 | B2 | 5/2012 | Frey | |
| 8,217,902 | B2 | 7/2012 | Chang | |
| 8,343,790 | B2 * | 1/2013 | Lutz et al. | 438/51 |
| 8,440,916 | B2 * | 5/2013 | Li et al. | 174/263 |

(Continued)

FOREIGN PATENT DOCUMENTS

WO WO 2012/129247 9/2012

OTHER PUBLICATIONS

U.S. Appl. No. 61/454,936, filed Mar. 21, 2011, Myers.

(Continued)

*Primary Examiner* — Xiaoliang Chen
(74) *Attorney, Agent, or Firm* — Baker Botts LLP

(57) ABSTRACT

Insulating substrates may be selectively removed to form electrical connections between conductive patterns on different faces of the insulating substrate or between conductive patterns on the insulating substrate and external circuits.

6 Claims, 15 Drawing Sheets

(56) References Cited

U.S. PATENT DOCUMENTS

| | | | |
|---|---|---|---|
| 2002/0045394 A1* | 4/2002 | Noda et al. | 442/180 |
| 2002/0171065 A1* | 11/2002 | Lochun et al. | 252/500 |
| 2004/0214422 A1* | 10/2004 | Sato | 438/622 |
| 2005/0083307 A1* | 4/2005 | Aufderheide et al. | 345/173 |
| 2005/0196710 A1* | 9/2005 | Shiroguchi | 430/322 |
| 2006/0115983 A1* | 6/2006 | Fujii et al. | 438/640 |
| 2006/0169485 A1* | 8/2006 | Kawaguchi et al. | 174/254 |
| 2006/0220245 A1* | 10/2006 | Ho et al. | 257/738 |
| 2006/0272850 A1* | 12/2006 | Morimoto et al. | 174/254 |
| 2006/0281297 A1* | 12/2006 | Ogawa et al. | 438/622 |
| 2006/0284300 A1* | 12/2006 | Nishizawa et al. | 257/687 |
| 2007/0026196 A1* | 2/2007 | Ogawa et al. | 428/157 |
| 2007/0178279 A1* | 8/2007 | Ogawa et al. | 428/137 |
| 2007/0281387 A1* | 12/2007 | Lutz et al. | 438/106 |
| 2008/0105456 A1* | 5/2008 | Kawaguchi et al. | 174/255 |
| 2008/0170819 A1* | 7/2008 | Kodama et al. | 385/14 |
| 2008/0186288 A1* | 8/2008 | Chang | 345/174 |
| 2008/0192001 A1* | 8/2008 | Choi et al. | 345/104 |
| 2008/0289859 A1* | 11/2008 | Mikado et al. | 174/254 |
| 2008/0309635 A1 | 12/2008 | Matsuo | |
| 2009/0085152 A1* | 4/2009 | Bernstein et al. | 257/529 |
| 2009/0145651 A1* | 6/2009 | Yoshino et al. | 174/263 |
| 2009/0217518 A1* | 9/2009 | Hiroshi et al. | 29/832 |
| 2009/0236151 A1* | 9/2009 | Yeh et al. | 178/18.03 |
| 2009/0237365 A1* | 9/2009 | Choi et al. | 345/173 |
| 2009/0242283 A1* | 10/2009 | Chiu | 178/20.01 |
| 2009/0315854 A1 | 12/2009 | Matsuo | |
| 2010/0038778 A1* | 2/2010 | Lee et al. | 257/737 |
| 2010/0183920 A1* | 7/2010 | Shaffer et al. | 429/210 |
| 2011/0049646 A1* | 3/2011 | Lim et al. | 257/410 |
| 2011/0210935 A1* | 9/2011 | Chuang | 345/174 |
| 2012/0013544 A1* | 1/2012 | Philipp | 345/173 |
| 2012/0062472 A1* | 3/2012 | Yilmaz | 345/173 |
| 2012/0113014 A1* | 5/2012 | Yilmaz | 345/173 |
| 2012/0127079 A1* | 5/2012 | Trend et al. | 345/168 |
| 2012/0139864 A1* | 6/2012 | Sleeman et al. | 345/174 |
| 2012/0242588 A1 | 9/2012 | Myers | |
| 2012/0242592 A1 | 9/2012 | Rothkopf | |
| 2012/0243151 A1 | 9/2012 | Lynch | |
| 2012/0243719 A1 | 9/2012 | Franklin | |
| 2013/0076612 A1 | 3/2013 | Myers | |

OTHER PUBLICATIONS

U.S. Appl. No. 61/454,950, filed Mar. 21, 2011, Lynch.
U.S. Appl. No. 61/454,894, filed Mar. 21, 2011, Rothkopf.
Cambrios Technologies Corporation Awarded Department of Defense Contract for Flexible Solar Cells, Sunnyvale, CA, Apr. 12, 2010, Cambrios Technologies Corp., Printed from website: http://www.cambrios.com/200/DOD_Release.htm on Apr. 20, 2010.
Core Applications & Technologies, Printing of Antennas and Flexible Circuits, Conductive InkJet Technology Ltd. (2009).
Horteis et al., "Fine Line Printed and Plated Contacts on High Ohmic Emitters Enabling 20% Cell Efficiency," Fraunhofer Institute for Solar Energy Systems, IEEE (2009).
Latest News, Conductive InkJet Technology, Printed from Website: http://www.conductiveinkjet.com/about-us/latest-news/2009.aspx on Apr. 20, 2010.
News, New Silver Conductive Inks Target High-Growth Touch Screen and OLED Markets, DuPont Microcircuit Materials Expands Innovative Offerings for Printed Electronics, Research Triangle Park, N.C., Apr. 13, 2010, Printed from website: http://www2dupont.com/MCM/en_US/news_events/article20100413.html on Apr. 20, 2010.
U.S. Appl. No. 12/606,934, filed Oct. 27, 2009, Harald Philipp.

* cited by examiner

SUBSTRATE FOR ELECTRICAL COMPONENT AND METHOD

BACKGROUND

A position sensor can detect the presence and location of a touch by a finger or by an object, such as a stylus, within an area of an external interface of the position sensor. In a touch sensitive display application, the position sensor enables, in some circumstances, direct interaction with information displayed on the screen, rather than indirectly via a mouse or touchpad. Position sensors can be attached to or provided as part of devices with a display. Examples of devices with displays include, but are not limited to, computers, personal digital assistants, satellite navigation devices, mobile telephones, portable media players, portable game consoles, public information kiosks, and point of sale systems. Position sensors have also been used as control panels on various appliances.

There are a number of different types of position sensors. Examples include, but are not limited to resistive touch screens, surface acoustic wave touch screens, capacitive touch screens, and the like. A capacitive touch screen, for example, may include an insulator coated with a transparent conductor in a particular pattern. When an object, such as a finger or a stylus, touches the surface of the screen there may be a change in capacitance. This change in capacitance may be sent to a controller for processing to determine where the touch occurred on the touch screen.

In a mutual capacitance configuration, for example, an array of conductive drive electrodes or lines and conductive sense electrodes or lines can be used to form a touch screen having capacitive nodes. A node may be formed where a drive electrode and a sense electrode overlap. The electrodes may be separated by an insulator to avoid electrical contact. The sense electrodes may be capacitively coupled with the drive electrodes at the nodes. A pulsed or alternating voltage applied on a drive electrode may therefore induce a charge on the sense electrodes that overlap with the drive electrode. The amount of induced charge may be susceptible to external influence, such as from the proximity of a nearby finger. When an object touches the surface of the screen, the capacitance change at each node on the grid can be measured to determine the position of the touch.

An electrical interconnection between conductive patterns on two surfaces of a substrate 10 is illustrated in FIG. 1. As illustrated in FIG. 1 the substrate 10 may have conductive contact pads 11 and 12 formed at corresponding positions on opposite faces 10a and 10b of the substrate 10. The conductive contact pads 11 and 12 may be connected to respective conductive patterns on the opposite faces 10a and 10b of the substrate 10. An aperture 13 may pass through the substrate 10 and the contact pads 11 and 12. The aperture 13 may be full of a conductive metal 14, so that the conductive metal 14 forms a conductive connection between the contact pads 11 and 12. The aperture 13 may be formed, for example, using a focused laser beam to cut through the substrate 10 and the contact pads 11 and 12. In order to form a reliable conductive connection to each of the contact pads 11 and 12 the conductive metal 14 may extend across and contact the exposed outer faces of the contact pads 11 and 12 in a mushroom, or rivet head, shaped arrangement.

FIG. 8 shows a side view of a touch position-sensing panel 1. The touch position-sensing panel 1 may be formed from a PET substrate 40 having opposing faces 40a and 40b. The PET substrate 40 may have conductive patterns 42 on face 40a of the PET substrate 40 and conductive patterns 41 on an opposite face 40b of the PET substrate 40.

The conductive patterns 42 and 41 may define electrodes similar to the electrodes discussed above with respect to FIG. 1 or connections to such electrodes. The conductive patterns 42 and 41 may define other circuitry. The conductive patterns 42 and 41 are not shown in detail in FIG. 8. The face 40a of the PET substrate 40 may be attached to a transparent covering sheet 43 by a layer of optically clear adhesive 44.

The PET substrate 40 may have an edge 40c. Near to the edge 40c of the PET substrate 40, conductive pattern 41 may define a bond pad region having a number of electrical connectors 45 on face 40b of the PET substrate 40 and the conductive pattern 42 may define a bond pad region having a number of electrical connectors 46 on the opposite face 40a of the PET substrate 40. A double sided flexible printed circuit (FPC) connector 47 connects to electrical connectors 46 and 45. The FPC connector 47 may connect circuits on both opposite faces 40a and 40b of the PET substrate 40 to external circuitry. As shown in FIG. 8, the FPC connector 47 may extend along both opposite sides of the edge 40a of the PET substrate 40 to allow the FPC connector 47 to contact electrical connectors 46 and 45 on opposite faces 40a and 40b of the PET substrate 40. The PET substrate 40 may have a kinked section 48 to provide clearance between the edge 40a of the PET substrate 40 and the optically clear adhesive layer 44 so that the FPC connector 47 can extend between face 40a of the PET substrate 40 and the optically clear adhesive layer 44. The FPC connector 47 may be bonded to the PET substrate 40 by a heat and pressure bonding process.

An example of a stage in the manufacture of a touch position-sensing panel by a reel to reel process is illustrated in FIGS. 10a and 10b, which show a plan view and a side view respectively of a laminated sheet 60. A core of the laminated sheet 60 may be a PET sheet 68 having two opposite faces 68a and 68b. The PET sheet 68 may have a number of conductive patterns 61 formed on face 68a of the PET sheet 68. The conductive patterns 61 may be arranged in a number of lines with the edges of the conductive patterns 61 in each line being aligned. Each conductive pattern 61 may define the electrodes and associated conductors required on face 68a of a PET substrate of a touch position-sensing panel. Each conductive pattern 61 may include a bond pad 62 where electrodes intended to be used to connect the conductive pattern 61 to external circuits may be grouped together. A transparent covering sheet 63 may overlay each of the conductive patterns 61. The transparent covering sheet 63 may be secured to face 68a of the PET sheet 68 by an adhesive layer 64 of optically clear adhesive. The PET sheet 68 may have one or more conductive patterns 65 formed on the opposite face 68b of the PET sheet 68 at locations corresponding to the locations of the conductive patterns 61 on face 68a of the PET sheet 68. The conductive patterns 65 may be arranged in a number of lines with the edges of the conductive patterns 65 in each line being aligned. Each conductive pattern 65 defines the electrodes and associated conductors required on opposite face 68b of a PET substrate of a touch position-sensing panel. Each conductive pattern 65 includes a bond pad 69 (not shown) where electrodes intended to be used to connect the conductive pattern 65 to external circuits may be grouped together. A transparent covering sheet 66 overlies each of the conductive patterns 65 in a line of conductive patterns 65. The transparent covering sheet 66 may be secured to face 68b of the PET sheet 60 by an adhesive layer 67 of optically clear adhesive.

The conductive patterns 61 and 65 and edges of the transparent covering sheets 63 and 66 may be aligned so that the bond pads 62 and 69 are exposed and are not covered by the respective transparent covering sheets 63 and 66.

The illustrated laminated sheet 60 may be formed by a continuous reel to reel process in which a continuous PET sheet 68 bearing conductive patterns 61 and 65 passes between two transparent covering sheets 63 and 66 bearing respective adhesive layers 64 and 67. The transparent covering sheets 63 and 66 and the respective adhesive layers may be adhered to the opposite faces 68a and 68b of the PET sheet 68 to form the laminated sheet 60. The laminated sheet 60 may be rolled onto a reel for storage. A section of the laminated sheet 60 having a single conductive pattern 61 and a single conductive pattern 65 may be cut from the laminated sheet 60 to form a PET substrate for a touch position-sensing panel.

SUMMARY

Insulating substrates may be selectively removed to form electrical connections between conductive patterns on different faces of the insulating substrate or between conductive patterns on the insulating substrate and external circuits.

BRIEF DESCRIPTION OF THE FIGURES

The figures depict one or more implementations in accordance with the present disclosure, by way of example, not by way of limitation. In the figures, like reference numerals refer to the same or similar elements.

FIG. 3b is a cross sectional view of the PET substrate of FIG. 3a;

FIG. 3c is a plan view of another stage in producing a via through the PET substrate of FIG. 3a;

FIG. 3e is a plan view of another stage of producing a via through the PET substrate of FIG. 3a;

FIG. 5b is a cross sectional view of the PET substrate of FIG. 5a;

FIG. 6b is a cross sectional view of the PET substrate of FIG. 6a;

FIG. 6c is a cross sectional view of another stage of attaching a device to the PET substrate of FIG. 6a;

FIG. 9b is a side view of the connector section of the PET substrate of FIG. 9a;

FIG. 9c is an end view of another stage of forming the connector section of the PET substrate of FIG. 9a;

FIG. 9d is an end view of another stage of forming the connector section of the PET substrate of FIG. 9a;

FIG. 9f is an end view of another stage of forming the connector section of the PET substrate of FIG. 9a;

FIG. 10b is a side view of the stage of producing PET substrates of FIG. 10a;

FIG. 11b is a side view of the stage of forming a PET substrate of FIG. 11a;

FIG. 12a is a plan view of another stage of forming a PET substrate of FIG. 11a;

FIG. 12b is a side view of the stage of forming a PET substrate of FIG. 12a;

FIG. 12c is a plan view of another stage of forming a PET substrate of FIG. 11a;

FIG. 13b is a side view of the stage of forming a bond pad of a PET substrate of FIG. 13a;

FIG. 14b is a side view of the stage of forming a bond pad of a PET substrate of FIG. 14a;

FIG. 14c is a plan view of another stage of forming a bond pad of a PET substrate of FIG. 14a.

DETAILED DESCRIPTION

In the following detailed description, numerous specific details are set forth by way of examples. In order to avoid unnecessarily obscuring examples of the present disclosure, those methods, procedures, components, and/or circuitry that are well-known to one of ordinary skill in the art have been described at a relatively high level.

Reference is now made in detail to the examples illustrated in the accompanying figures and discussed below.

A display may be overlaid with a touch position-sensing panel to implement a touch sensitive display device. Exemplary displays include liquid crystal displays, active matrix liquid crystal displays, electroluminescent displays, electrophoretic displays, plasma displays, cathode-ray displays, OLED displays, or the like. It will be appreciated that light emitted from the display may be able to pass through the touch position-sensing panel with minimal absorption or obstruction.

Figure 1:
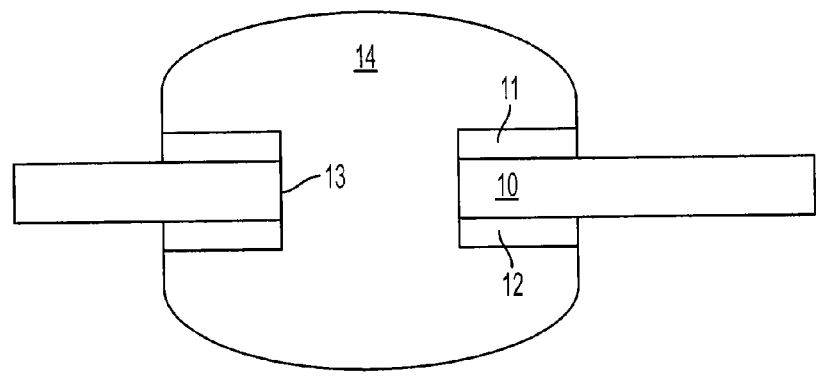
FIG. 1 illustrates schematically a cross-sectional view of an electrical interconnection between contacts on opposite faces of a conventional substrate.
Figure 2:
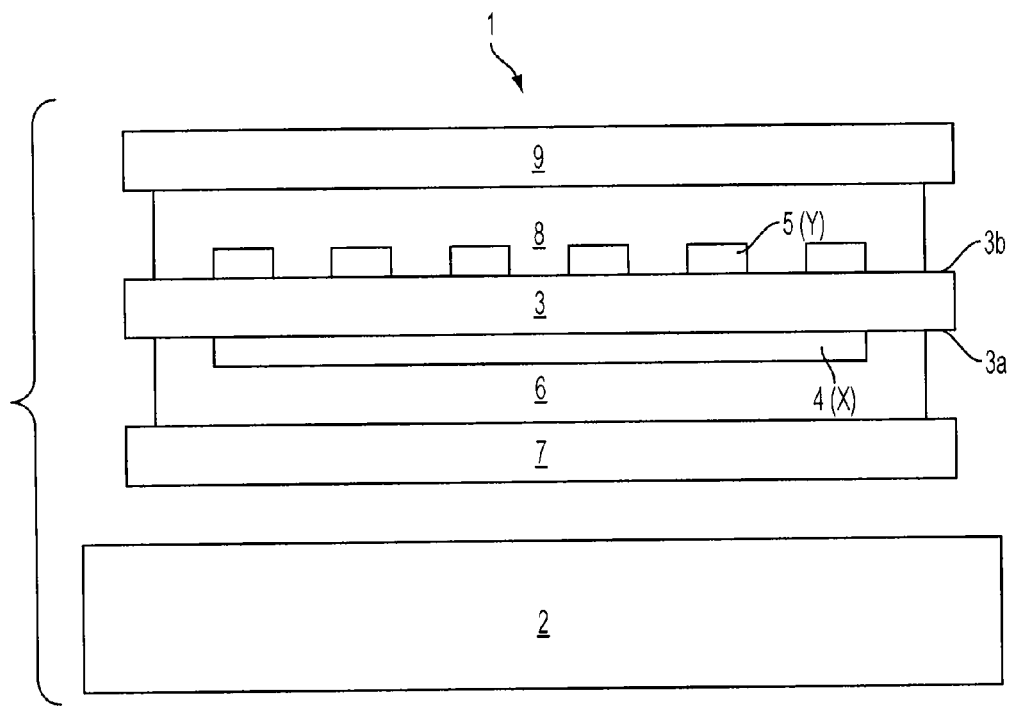
FIG. 2 illustrates schematically a cross-sectional view of a touch sensitive panel.

FIG. 2 illustrates an exemplary touch position-sensing panel 1 which overlies a display 2. In the illustrated example, the panel 1 includes a polyethylene terephthalate (PET) substrate 3 having two opposing faces 3a and 3b. The substrate 3 forms a core of the exemplary touch sensitive position-sensing panel 1. Although the substrate may be used in touch sensors implementing other types of touch sensing, for discussion purposes, the drawing shows an example of a structure that may be used to implement a mutual capacitance type touch sensitive panel.

The panel 1 includes a number of electrodes 4 (X) and a number of electrodes 5 (Y) provided on opposite faces 3a and 3b of the PET substrate 3. The electrodes 4 (X) may be arranged in one direction and electrodes 5 (Y) may be arranged in another different direction. Other conductive tracks may also be provided on the opposing faces 3a and 3b of the PET substrate 3. Such other conductive tracks may provide drive and sense connections to the electrodes 4 (X) and 5 (Y). The PET substrate 3 may be provided adjacent to the display 2 such that electrodes 4 (X) are between the display 2 and the PET substrate 3. An adhesive layer 6 of an optically clear adhesive may be between the electrodes 4 (X) and transparent covering sheet 7. An adhesive layer 8 of an optically clear adhesive may be between the electrodes 5 (Y) and transparent covering sheet 9. A gap may be formed between the display 2 and the transparent covering sheet 7.

The transparent covering sheet 7 and the adhesive layer 6 of optically clear adhesive encapsulate the electrodes 4 (X), and any other conductive tracks formed on face 3a of the PET substrate 3. The transparent covering sheet 9 and the adhesive layer 8 of optically clear adhesive encapsulate electrodes 5 (Y), and any other conductive tracks formed on the face 3b of the PET substrate 3. The encapsulation of electrodes 4 (X) and 5 (Y), and any other conductive tracks, may provide protection from physical and environmental damage.

In the mutual capacitance example, electrodes 4 (X) may be drive electrodes provided on face 3a of the PET substrate 3, and electrodes 5 (Y) may be sense electrodes provided on the opposing face 3b of the PET substrate 3. Capacitive sensing channels may be formed by capacitive coupling nodes in the localized regions at an around where electrodes 4 (X) and 5 (Y) cross over each other and are separated by the non-conductive PET substrate 3.

The transparent covering sheets 7 and 9 may be formed from PET. In other examples transparent covering sheets 7 and 9 may be formed from glass, polycarbonate, or polymethylmethacrylate (PMMA). In some examples, the transparent covering sheet 9 may be the front lens or outer surface of the touch position-sensing panel 1.

The electrodes 4 (X) and 5 (Y) may be formed of indium tin oxide (ITO). ITO is a clear conductive material that may be used for electrodes. However, any clear conductive material may be used, such as, antimony tin oxide (ATO), tin oxide, PEDOT or other conductive polymers, carbon nanotube or metal nanowire impregnated materials, or other inorganic and organic conductive materials.

In other examples, electrodes 4 (X) and or electrodes 5 (Y) may be formed from a conductive material, such as a metal. Suitable metals include copper, silver, gold, aluminum, tin and other metals used in conductive wiring. In some examples, the sense electrodes may be patterned in narrow lines to allow most of the light emitted from the display and incident on the sense electrode layer to pass through the electrode layer between the narrow metal lines. The narrow lines may be no more than 20 microns wide. An exemplary range may be 3-10 microns. Narrower lines have reduced visibility to the naked eye. By forming electrodes 4 (X) or 5 (Y) from narrow conductive lines, the position-sensing panel may be formed such that no more than about 10% of the active area is covered by the metal lines of the electrodes. Less coverage of the active area allows for greater transparency of the position-sensing panel, reduces visibility of the electrodes to the human eye and reduces perceptible darkening or other loss of display quality.

In some examples, electrodes 4 (X) may be formed from a clear conductive material and electrodes 5 (Y) may be formed from narrow conductive metal lines. In other examples, electrodes 4 (X) may be formed from narrow conductive metal lines and the electrodes 5 (Y) may be formed from a clear conductive material.

In an example where other conductive tracks in addition to electrodes 4 (X) and 5 (Y) are provided on the PET substrate 3, the other conductive tracks may also be formed from a clear conductive material or narrow conductive metal lines, in a manner similar to the electrode layers 4 (X) and 5 (Y). In this example where the other conductive tracks, or parts of the other conductive tracks, lie outside a visible region of the display 2, the light-transmissibility of the other conductive tracks is of no concern.

Where substrates have conductive patterns on two opposed faces of the substrate, electrical interconnections or vias may be provided between the conductive patterns on the two faces of a substrate. Such vias can be used to allow more flexible routing of conductive tracks by allowing tracks to cross over one another. Further, vias may be used to allow all of the electrical connections from the substrate to external circuits to be located on the same surface of the substrate. This may allow a single zero insertion force (ZIF) socket to connect through electrical connections on one face of the substrate to circuits on both faces of the substrate. ZIF sockets may be connected to electrical connections on one face of a substrate so that, without vias, two ZIF sockets would be required to connect to electrical connections on two opposed faces of a substrate.

An example of a via through a PET substrate and a method of forming the via is illustrated in FIGS. 3a to 3f and FIG. 4.

Figure 3A:
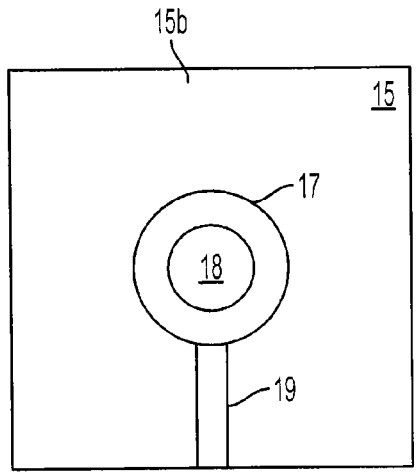
FIG. 3a is a plan view of a stage of producing a via through a PET substrate.
Figure 3B:
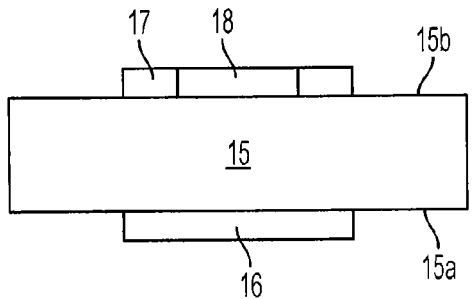

FIG. 3a and FIG. 3b are a plan view and a cross sectional view of a section of a PET substrate 15 having faces 15a and 15b on either side. The PET substrate 15 may have a conductive pad 16 on face 15a, and a conductive pad 17 on face 15b opposite to face 15a. The conductive pads 16 and 17 may be formed by patterned layers of copper. The conductive pads 16 and 17 may be formed at corresponding positions on opposite faces 15a and 15b of the PET substrate 15 so that the conductive pads 16 and 17 overlie one another when separated by the insulating PET substrate 15. In this example, conductive pad 16 may be a substantially continuous circular area of copper. The conductive pad 17 may be a circular annulus of copper having a central opening 18. The conductive pad 17 may be connected to a conductive copper track 19 extending across face 15b of the PET substrate 15 and connecting conductive pad 17 to circuitry (not shown) on face 15b of the PET substrate 15. Similarly, conductive pad 16 may be connected to a copper conductive track extending across face 15a of the PET substrate 15 and connecting conductive pad 16 to circuitry (not shown) on face 15a of the PET substrate 15. The thickness of the PET substrate 15 may be between approximately 12 µm and approximately 125 µm, for example, the thickness of the PET substrate 15 may be about 50 µm. In other examples, conductive pads 16 and 17 and the conductive track 19 may be from 1 µm to 2 µm thick.

Figure 4:
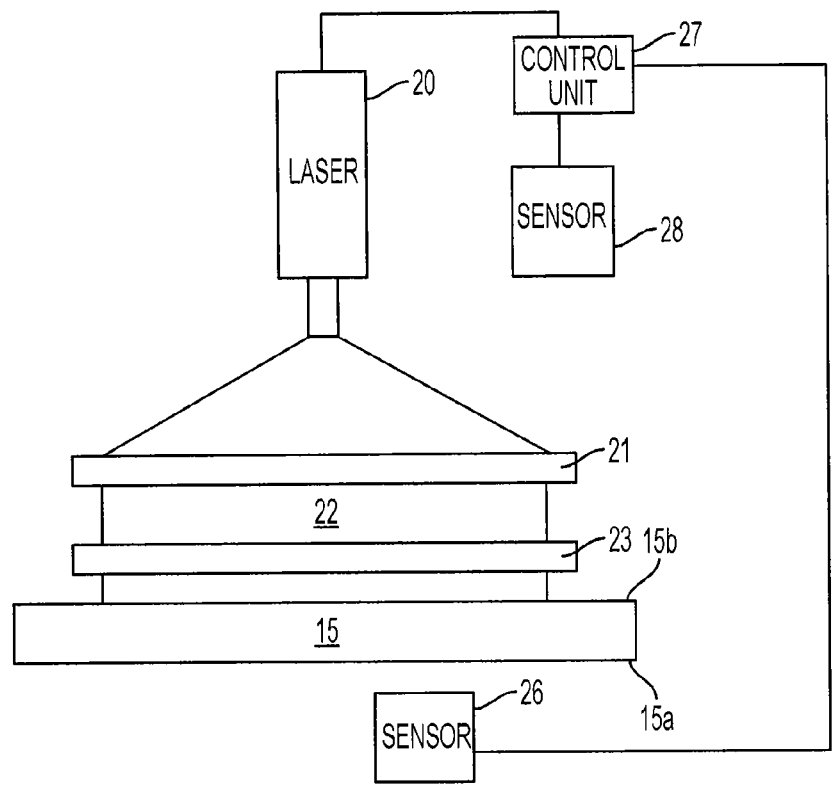
FIG. 4 illustrates schematically a laser optical system for use in processing a PET substrate.

In the example of FIG. 4, a pulsed laser 20 may be used to selectively remove material of the PET substrate 15. The laser 20 may have optics 21 arranged to spread radiation emitted by the laser 20 into a broad beam 22 across a large area of face 15b of the PET substrate 15 through a stencil or mask 23. This may allow a large area of face 15b of the PET substrate 15 to be flash illuminated by each pulse emitted by the laser 20. The mask 23 may selectively block or pass the radiation from the laser 20 in order to control which parts of face 15b of the PET substrate 15 are illuminated by the laser 20. This in turn may control from which parts of the PET substrate 15 material is removed.

In one example, the pulsed laser 20 may be a 246 nm wavelength UV excimer laser having a pulse emission rate of 100 Hz. A control unit 27 may control operation of the pulsed laser 20. In one example, the control unit 27 may control the amount of energy in each pulse emitted by the laser 20 using pulse width modulation. At least during some operations, the control unit 27 may receive inputs from one or more sensors, two examples 27 and 28 of which will be discussed later. During formation of the recess 24, the amount of PET removed by each pulse emitted by the laser 20 may depend, among other things, on the power of the laser 20 and the area of the PET substrate 15 illuminated by the beam 22. In one example, the laser 20 may be arranged to remove 0.1 μm of PET with each pulse emitted when the laser 20 is operating at full power.

Figure 3C:
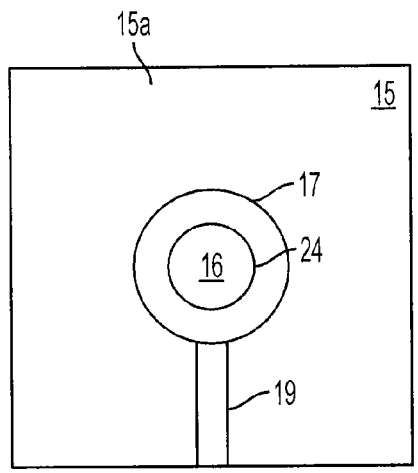
Figure 3D:
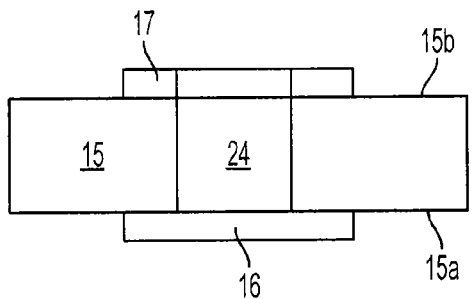
FIG. 3d is a cross sectional view of the PET substrate of FIG. 3C.

The pulsed laser 20 acting through the mask 23 may be operated to selectively illuminate the approximate center of conductive pad 17 of FIGS. 3a-3b so that radiation emitted by the pulsed laser 20 passes through the central opening in conductive pad 17 and illuminates face 15b of the PET substrate 15. The radiation emitted by the pulsed laser 20 selectively removes PET material from the illuminated region to form a cylindrical recess 24 extending from the central opening 18 in conductive pad 17 through the substrate 15 to conductive pad 16, as shown in FIGS. 3c and 3d. The selective illumination and selective removal of material using the pulsed laser 20 may continue until the rear surface of conductive pad 16 facing the substrate 15 is exposed at the bottom of the cylindrical recess 24.

The number and energy of the pulses emitted by the laser 20 may be controlled to remove sufficient PET material to expose conductive pad 16 without substantially penetrating conductive pad 16. This control of the depth of the recess 24 may be simplified by the use of a 246 nm wavelength UV excimer laser, which may remove PET more quickly than copper.

The cylindrical recess 24 may have a smaller diameter than the conductive pads 16 and 17. Accordingly, the forming of the cylindrical recess 24 by the laser 20 does not destroy conductive pads 16 and 17 or cause conductive pads 16 and 17 to separate from the PET substrate 15. The relative dimensions of the cylindrical recess 24 and conductive pads 16 and 17 may be such that after the recess 24 has been formed, the remaining contact area between each of conductive pad 16 and conductive pad 17 and the PET substrate 15 may be sufficient to securely retain conductive pads 16 and 17 on the substrate 15. The recess 24 having a smaller diameter than conductive pads 16 and 17 may also provide some margin to allow for small amounts of misalignment between the PET substrate 15 and the attached conductive pads 16 and 17, and the laser 20 and mask 23.

Figure 3E:
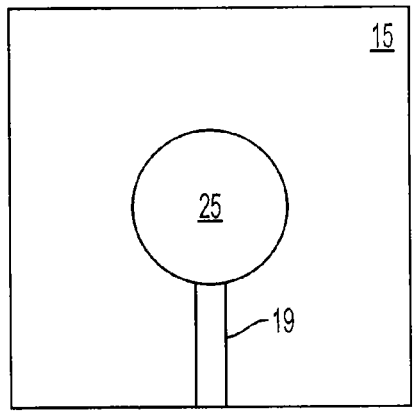
Figure 3F:
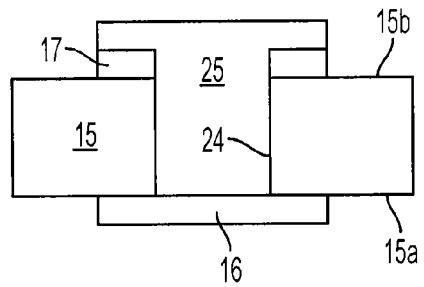
FIG. 3f is a cross sectional view of the PET substrate of FIG. 3c.

After formation of the recess 24, recess 24 may be filled with conductive material 25, as shown in FIGS. 3e and 3f. The conductive material 25 contacts the rear surface of conductive pad 16. The conductive material extends within the recess 24 through the PET substrate 15. The conductive material contacts the inner wall of the opening 18 of conductive pad 17, and in the example, the conductive material 25 extends over and contacts at least some of the front surface of conductive pad 17, which is the surface of conductive pad 16 facing away from the PET substrate 15. These contacts by the conductive material 25 may provide a conductive electrical connection between conductive pads 16 and 17. The conductive electrical connection between conductive pads 16 and 17 may provide a via passing through the insulating PET substrate 15. The conductive material 25 may form a conductive connection with the rear surface of conductive pad 16 and with the front surface of conductive pad 17.

There is no requirement for the conductive material 25 to project outwardly from face 15a of the PET substrate 15 beyond conductive pad 16. This may allow the thickness of the conductive connection to be reduced. If provided, the extension of the conductive material 25 may project 10 μm to 50 μm outward from the face 15a of the PET substrate 15 in order to form a bond with a front surface of a conductive pad. Irregularity in the profile of face 15a may be reduced as a result of conductive material projecting outwardly from face 15a by unpredictable or variable amounts. In some examples, the conductive connection may be formed without requiring access to face 15a of the PET substrate 15. In other examples, the conductive connection may be formed after face 15a of the PET substrate 15 has been encapsulated. For example, face 15a of the PET substrate 15 may be encapsulated by securing a transparent cover sheet to face 15a of the PET substrate 15 using optically clear adhesive. The conductive connection between conductive pads 16 and 17 on faces 15a and 15b of the PET substrate 15 may be formed later. In some examples, the thickness of the optically clear adhesive may be about 50 μm. Encapsulating face 15a of the PET substrate 15 as soon as possible during the manufacturing process may be done in order to minimize the risk of physical or environmental damage to any circuitry on face 15a.

In one example, the conductive material 25 may be a printable carbon ink, which may be selectively printed onto face 15b of the PET substrate 15 to fill the aperture 24. The printed carbon ink may then be cured to form the conductive material 25 of conductive carbon material. An example of a suitable printable carbon ink is Electrodag 956 sold by Acheson Colloiden B.V. of The Netherlands. In other examples, the recess 24 may be filled with a silver loaded epoxy material, a metal, or a metal alloy.

The illustrated example above shows and describes the forming of a single conductive electrical connection between conductive pads 16 and 17 on faces 15a and 15b of the PET substrate 15. The described technique can be used to produce multiple connections simultaneously across the area of the PET substrate 15 illuminated by the pulse laser 20. This illuminated area may cover an entire PET substrate 15 used to form a single touch position-sensing panel 1 so that the PET substrate 15 can be processed in a single pass. The illuminated area may be large enough to allow more than one PET substrate 15 to be processed simultaneously.

The PET substrate 15 may be formed from a PET sheet. For example, the PET substrate may be formed by cutting from a PET sheet. The thickness of PET sheets may vary slightly from sheet to sheet, or in the same sheet, as a result of manufacturing tolerances even when the PET sheets may have the same predetermined constant thickness. As a result, removing a set amount of material from a PET substrate 15, the set amount of material corresponding to the intended thickness of the PET substrate 15, may not reliably and correctly form a conductive electrical connection between conductive pads 16 and 17 on opposite faces 15a and 15b of the PET substrate 15.

In one example, the pulse laser 20 may be calibrated with respect to the PET substrate 15 by cutting a test hole through the PET substrate 15 with the pulse laser 20 in an otherwise unused location. With reference again to FIG. 4, a sensor 26 may be provided on the opposite side of the PET substrate 15 from the pulse laser 20. A control unit 27 may be provided to control the pulse laser 20, and the sensor 26 may provide data regarding sensed radiation to the control unit 27. The control unit 27 may process the received data in order to determine when radiation emitted by the pulse laser 20 is first detected by the sensor 26. This detection of the radiation from the pulse laser 20 may correspond to the test hole penetrating the PET substrate 15. The control unit 27 may determine the number and energy of the laser pulses required to penetrate the PET substrate 15. In practice, the thickness of each PET sheet may be relatively consistent across that PET sheet itself. Accordingly, the number and energy of the laser pulses used to penetrate the PET substrate 15 at the test hole location may be a sufficiently accurate indication of the number and energy of the laser pulses required at other locations on the same PET sheet to allow conductive electrical connections between conductive pads to be formed.

In another example a thickness of the PET substrate 15 may be measured and the number and energy of the laser pulses required to penetrate the PET substrate 15 may be calculated from the measured thickness. Alternatively, if a number of PET substrates may be formed from a single PET sheet, the number and energy of the laser pulses required to penetrate each of the PET substrates 15 may be calculated from the measured thickness of the PET sheet.

In a further example, a sensor 28 may be provided to detect and analyze radiation emitted by the PET substrate 15 when the PET substrate 15 is illuminated by radiation from the pulse laser 20. The sensor 28 may provide data regarding the sensed emitted radiation to the control unit 27. The control unit 27 may process the data in order to determine when the pulse laser 20 has removed sufficient PET from areas of the PET substrate 15 to expose copper metal of conductive pad 16. In one example, the sensor 28 may analyze radiation reflected from the PET substrate 15 and the control unit 27 may use changes in the sensed reflected radiation to identify when a change takes place from the reflected radiation having been reflected from a PET face 15a to the reflected radiation having been reflected from copper. This change may correspond to the recess 24 penetrating the thickness of the PET substrate 15 and exposing the rear surface of conductive pad 16. In another example, the sensor 26 may analyze radiation emitted from vapor released by the PET substrate 15 when the PET substrate 15 is illuminated by radiation from the pulse laser 20. The control unit 27 may use changes in the sensed emitted radiation to identify when a change takes place from the vapor having been released in response to the laser radiation striking PET to the vapor having been released in response to the laser radiation striking copper.

In one example, the sensor 28 detects radiation emitted by an exposed area of the PET substrate 15. The exposed area may be from a portion of to all of the exposed area. As explained above, the thickness of PET sheets may vary from sheet to sheet. However, the thickness of each PET sheet may be relatively consistent across the single PET sheet itself. Accordingly, in another example, the sensor 28 may sense radiation emitted from a more limited part of the exposed area of the PET substrate. This sensed part of the PET substrate may contain one or more sites where a conductive electrical connection may be formed. The progress of the PET removal at these one or more sites may be sufficient to estimate progress at other sites on the same PET substrate to allow the conductive electrical connections between conductive pads 16 and 17 to be formed with sufficient reliability.

In one example, the control unit 27 may operate the pulse laser 20 to remove a part of an amount of material at a high pulse energy setting and to then remove the remainder of the material at a lower pulse energy setting. In other examples, the part of the material removed at the high pulse energy setting may be about 90% of the material to be removed to form the recess. In other examples, the high pulse energy setting may be the maximum pulse energy setting of the pulse laser 20.

Figure 5A:
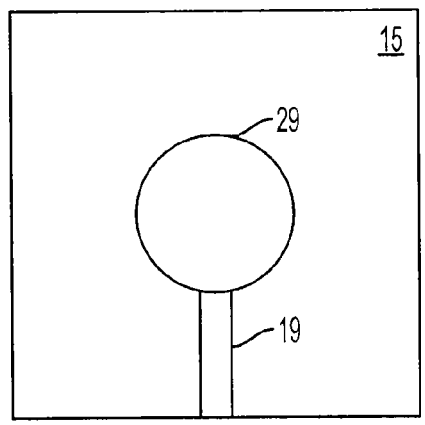
FIG. 5a is a plan view of a stage of another example of producing a via through a PET substrate.
Figure 5B:
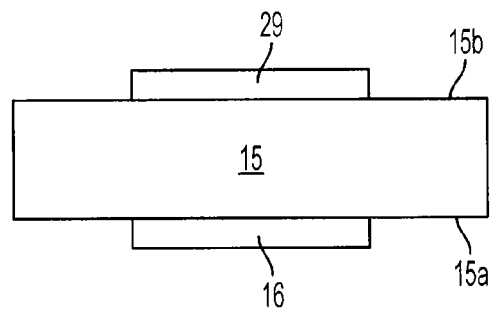

FIGS. 5a and 5b, show a plan view and a cross sectional view respectively of a section of a PET substrate 15. The PET substrate 15 may have opposite faces 15a and 15b. The PET substrate 15 may have a conductive pad 16 on face 15a, and a conductive pad 29 on the opposite face 15b. In this example, conductive pad 29 may be a continuous circular disc of copper without any central opening. When the pulsed laser 20 is used to selectively remove material from face 15b of the PET substrate 15, the laser radiation may first cut through the copper of conductive pad 29 to form an opening to allow the laser radiation to impinge on the PET material of the PET substrate 15. Otherwise, the method and the completed conductive electrical connection between conductive pad 16 and conductive pad 29 may be similar to those discussed above with respect to FIGS. 3a to 3f.

Figure 6A:
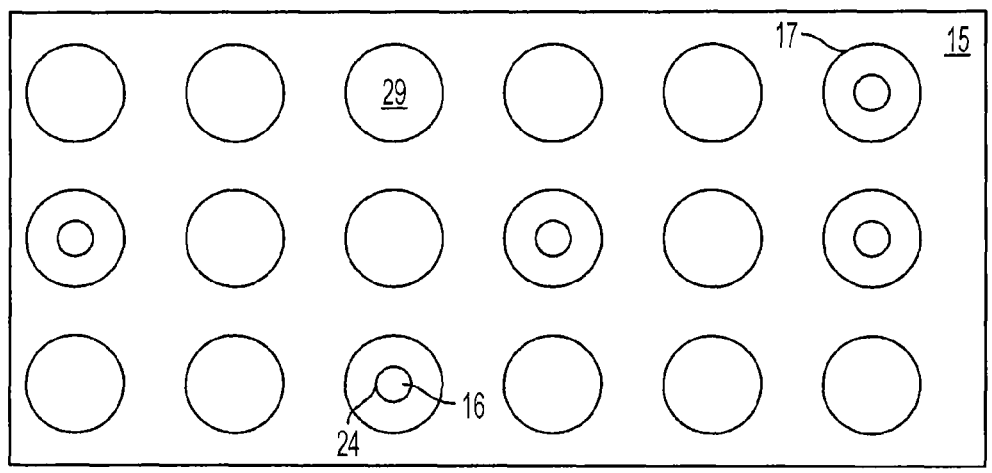
FIG. 6a is a plan view of a stage of attaching a device to a PET substrate.
Figure 6B:
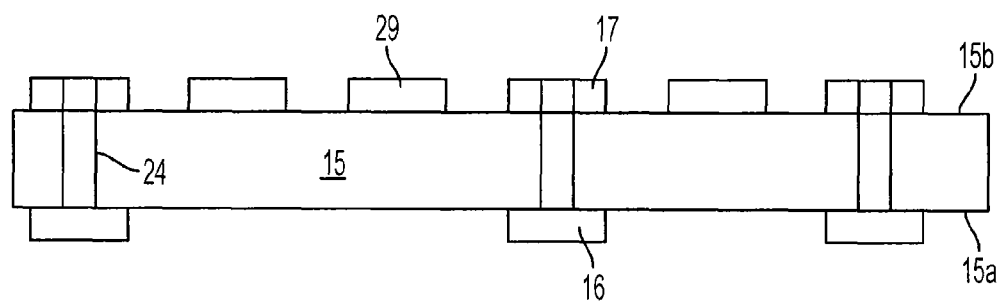
Figure 6C:
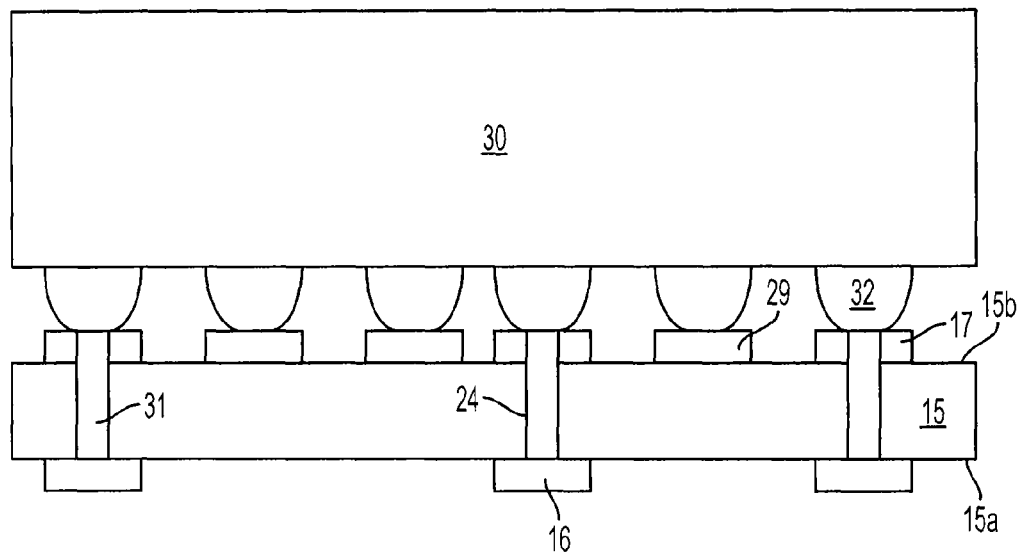

In another example shown in FIGS. 6a to 6c, recesses formed in a PET substrate 15 can be used to attach a face mounted device to the PET substrate 15 and to form electrical connections from a face mounted device to circuitry on both faces of the PET substrate 15.

FIGS. 6a and 6b show a plan view and a sectional view respectively of a section of a PET substrate 15. The PET substrate 15 may have opposite faces 15a and 15b. The PET substrate 15 may have more than one conductive pads 16 formed on face 15a of the PET substrate 15 and two or more conductive pads 17 and 29 formed on opposite face 15b of the PET substrate 15. The conductive pads 17 and 29 may be arranged in a two-dimensional pattern corresponding to the locations of contact pads of a face mounted device 30 which may be mounted on face 15b of the PET substrate 15. The annular conductive pads 17 with openings 18 may be located at positions where a conductive through connection or via from a contact pad of the face mounted device 30 is formed to the opposite face 15b of the PET substrate 15. Each conductive pad 16 may be located at a position on face 15a of the PET substrate 15 corresponding to the position of conductive pad 17 on the opposite face 15b. The disc shaped conductive pads 29 on face 15b may have no corresponding conductive pad 16 on face 15a. The conductive pads 16 may be connected to circuitry on face 15a of the PET substrate 15. The conductive pads 17 and 29 may be connected to circuitry on face 15b of the PET substrate 15.

The pulsed laser 20 in the example of FIG. 4 may be used to form recesses 24 passing through each of the conductive pads 17 and the PET substrate 15 to each of the conductive pads 16, as shown in FIGS. 6a and 6b.

As shown in FIG. 6c, the apertures 24 may be filled with conductor 31, such as solder paste. The face mounted device 30 may then be attached to the PET substrate 15 by a soldering process, for example induction soldering, to form solder bumps 32. The soldering process may also convert the solder paste within the apertures 24 into hardened solder 31. Each of the conductive pads 17 and 29 may be connected to a respective contact pad of the face mounted device 30 by a solder bump 32. At the locations of conductive pads 16 and the annular conductive pads 17, a solder bump 32 and solder 31 within an aperture 24 may provide an electrical connection extending between a contact pad of the face mounted device 30 mounted on face 15b of the PET substrate 15 and circuitry on the opposite face 15a of the PET substrate 15 connected to conductive pad 16. At each location of a disc shaped conductive pad 29, a solder bump 32 may provide an electrical connection from a contact pad of the face mounted device 30 mounted on face 15b of the PET substrate 15 to a disc shaped conductive pad 29 and through the pad 29 to circuitry on face 15b of the PET substrate 15. Such an arrangement in FIG. 6c may allow the face mounted device 30 to be physically attached to the PET substrate 15 and electrically connected to circuitry on both opposed faces 15a and 15b of the PET substrate in a single soldering operation.

Figure 7:
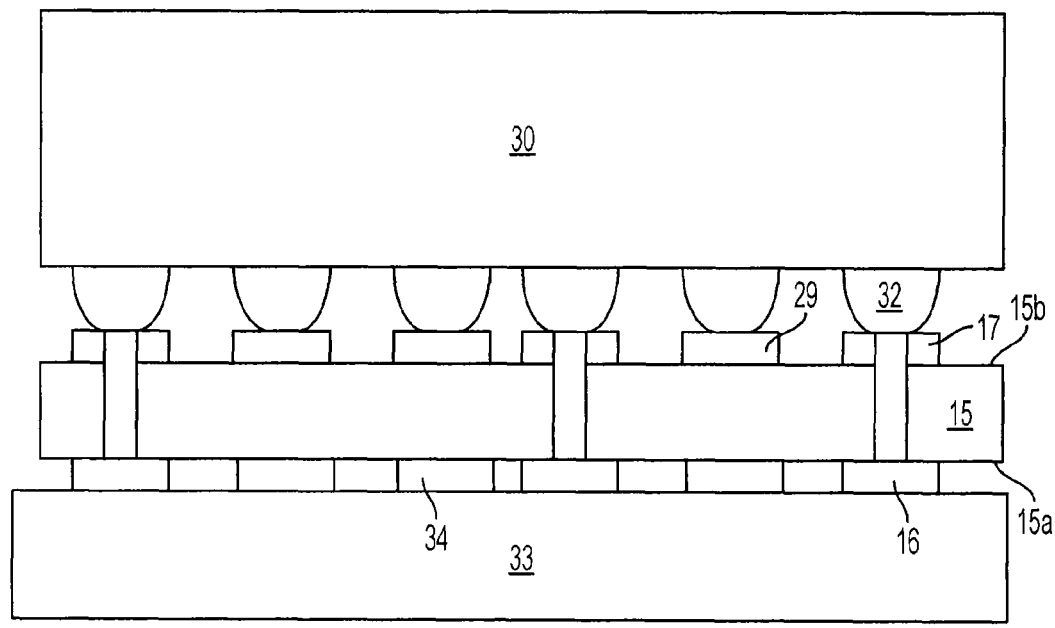
FIG. 7 is a cross section of an alternative arrangement for attaching a device to a PET substrate.
Figure 8:
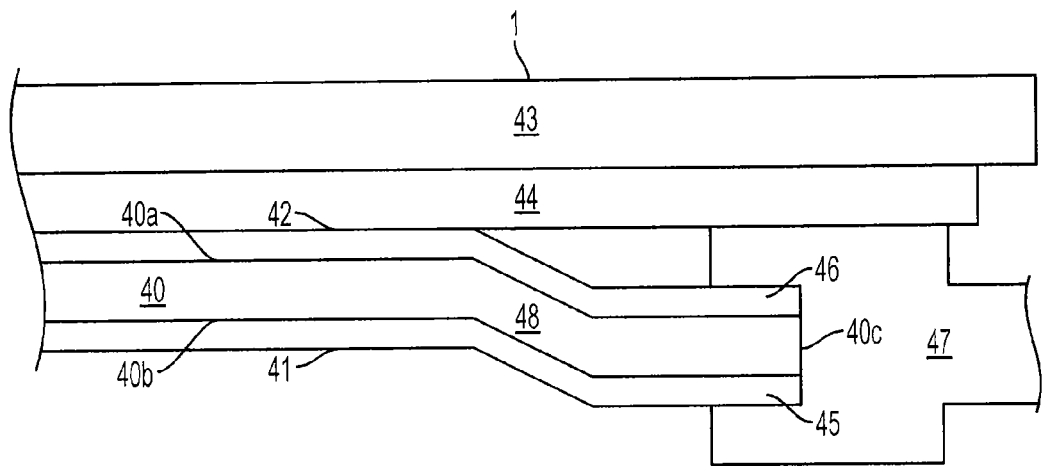
FIG. 8 illustrates schematically a cross sectional view of an exemplary touch sensitive panel.

As illustrated in FIG. 7, a stiffener 33 may be bonded to face 15a of the PET substrate 15. The stiffener 33 may be bonded to face 15a of the PET substrate 15 using an adhesive. The stiffener 33 supports the PET substrate 15 in the region where the face mounted device 30 may be attached. The support provided by the stiffener 33 may assist in preventing flexing or bending of the PET substrate 15 in or near to a region of the PET substrate 15 supporting the face mounted device 30. The region of the PET substrate 15 supporting the face mounted device 30 may be relatively highly loaded by the face mounted device 30. Flexing or bending of the substrate 15 in this region may tend to break the solder connections between the face mounted device 30 and the PET substrate 15 provided by the solder bumps 32.

In one example the stiffener 33 can be bonded to conductive pads 16 on face 15a of the PET substrate 15. In another example, additional conductive pads 34 may be formed on face 15a of the PET substrate 15. The additional conductive pads 34 are provided additionally to conductive pads 16 providing conductive connections from the face mounted device 30 mounted on face 15b of the PET substrate 15 to circuitry on face 15a of the PET substrate 15 as described above. The additional conductive pads 34 may provide additional contact between the stiffener 33 and the PET substrate 15 and may allow the stiffener 33 to be bonded more securely to the PET substrate 15.

Returning to FIGS. 6a to 6c, conductive connections may be formed between the face mounted device 30 mounted on face 15b of the PET substrate 15. Circuitry on the opposite face 15a of the PET substrate 15 may be formed without requiring access to face 15a of the PET substrate 15. This may allow the conductive connections to be formed after face 15a of the PET substrate has been encapsulated or otherwise rendered inaccessible.

Returning to FIG. 7, the conductive connections may be formed after a stiffener 33 has been bonded to face 15a of the PET substrate 15. This may allow the stiffener 33 to stabilize the PET substrate 15 during the soldering process to attach the face mounted device 30 while the solder is molten until the solder cools and solidifies. The molten solder may heat the PET substrate 15 and result in local softening of the PET substrate 15. The connections of the face mounted device 30 may be particularly vulnerable to disturbance while the solder is molten. The stiffener 33 may act as a heat sink to absorb some heat from the molten solder through pads 16 and may reduce local heating of the PET substrate 15.

As an alternate to using solder in the examples of FIGS. 6a to 7, the apertures 24 may be filled with a silver loaded epoxy material instead of a solder paste. Further, the conductive pads 17 and 29 may be connected to respective contact pads of the face mounted device 30 by a silver loaded epoxy material instead of solder bumps 32. In this alternative example the soldering process may be replaced by a curing process to cure the silver loaded epoxy material to physically attach the face mounted device 30 to the PET substrate 15 and electrically connect the face mounted device 30 to circuitry on both opposed faces 15a and 15b of the PET substrate 15. In one example the curing process may take place at a temperature of about 80° C.

In another example, printable carbon ink may be used in place of silver loaded epoxy material and/or solder. In another example, printable carbon ink may be used in addition to silver loaded epoxy material instead of solder paste.

The conductive pads 16, 17, 29 and 34 may have a similar thickness in some examples. In other examples, the conductive pads 16, 17, 29 and 34 may have different thicknesses. For example, the conductive pads 16 may be thicker than the conductive pads 17, 29 and 34. Thicker conductive pads 16 may provide more tolerance for errors or inaccuracy when removing the PET material to expose, but not penetrate, the conductive pads 16.

In some examples, the conductive pads 16, 17, 29 and 34 may be circular. However, the shape of the conductive pads 16, 17, 29 and 34 shown is not limited to circular shapes. In other examples the conductive pads 16, 17, 29 and 34 may have any shape, and different conductive pads 16, 17, 29 and 34 on the same substrate may have different shapes.

In the examples above, a pulse laser was used to selectively remove PET material from the PET substrate. In other examples, alternative methods of selectively removing a controlled thickness of PET may be used, such as a drill.

In order to operate a touch position-sensing panel, circuits on the faces of the PET substrate of the panel may be connected to external circuitry. This external circuitry may for example be drivers and/or sensors.

Figure 9A:
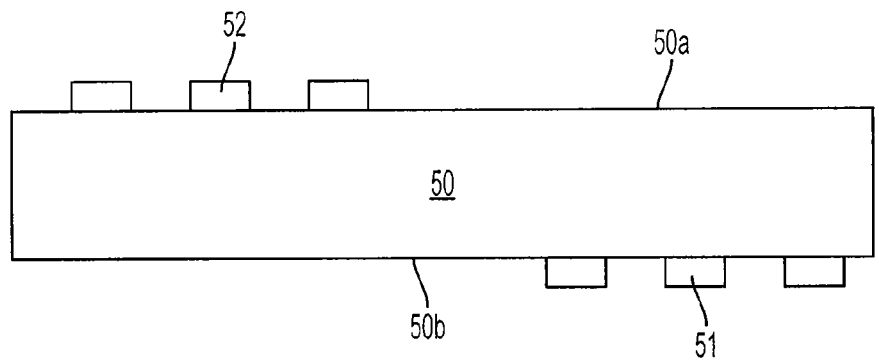
FIG. 9a is an end view of a stage of forming a connector section of a PET substrate.
Figure 9B:
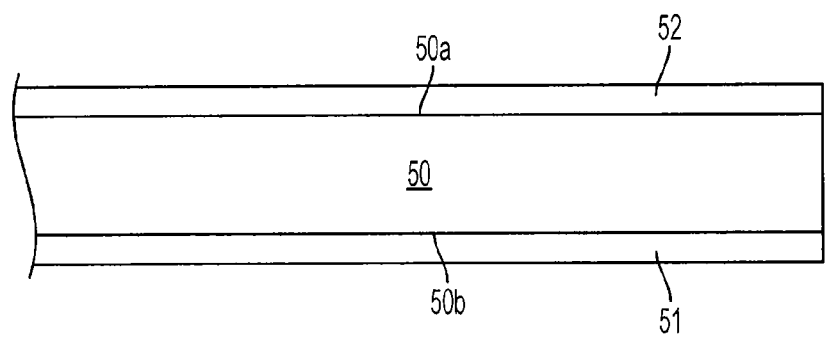

An example of a connection to a PET substrate and a method of making the connection are illustrated in FIGS. 9a to 9f. FIGS. 9a and 9b which show an end view and a side view respectively of an end section of a PET substrate 50. In one example, the PET substrate 50 may have opposite faces 50a and 50b. The PET substrate 50 may have a number of electrical connectors 52 on face 50a of the PET substrate 50, and a number of electrical connectors 51 on opposite face 50b of the PET substrate. The electrical connectors 52 may be grouped together in a bond pad region on face 50a of the PET substrate 50. The electrical connectors 51 may be grouped together in a bond pad region on face 50b of the PET substrate 50. The bond pad regions may be arranged so that the positions of electrical connectors 52 in the bond pad region on the face 50a of the PET substrate 50 do not correspond to the positions of electrical connectors 51 in the bond pad region on opposite face 50b of the PET substrate 50. The electrical connectors 52 and electrical connectors 51 may be formed by respective layers of copper. The electrical connectors 52 may be connected to circuitry (not shown) on face 50a of the PET substrate 50. Similarly, electrical connectors 51 may be connected to circuitry (not shown) on opposite face 50b of the PET substrate 50. In some examples, the thickness of the PET substrate 50 may be between approximately 40 µm and approximately 100 µm, for example, about 50 µm. In some examples, the electrical connectors may be 1 µm to 2 µm thick.

Figure 9C:
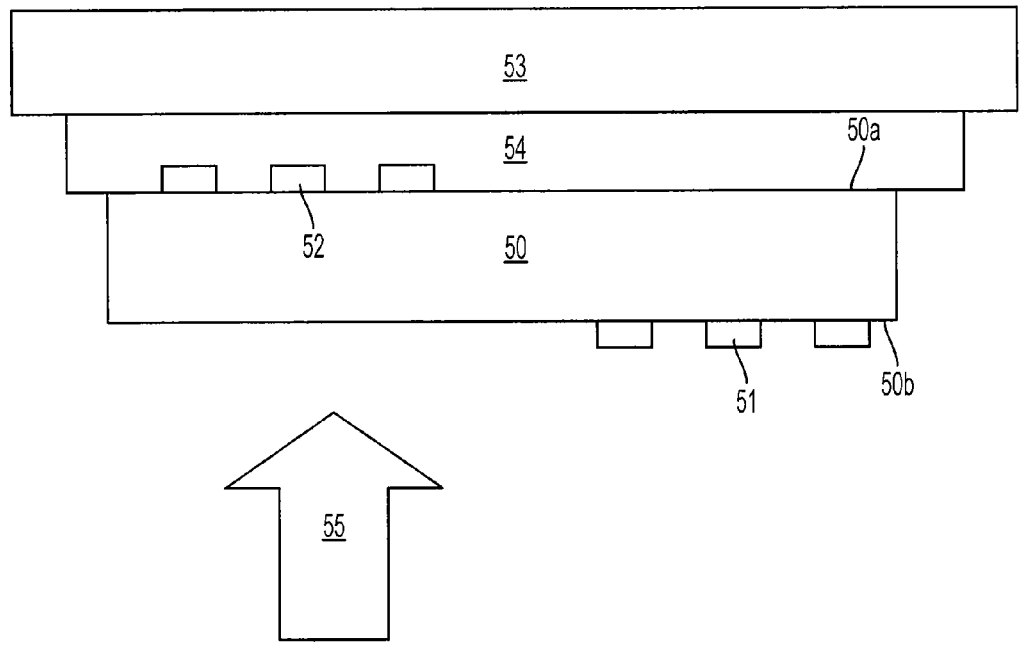

As shown in an exemplary end view in FIG. 9c, face 50a of the PET substrate 50 may be secured to a transparent covering sheet 53 by a layer of optically clear adhesive 54.

The PET material of the PET substrate 50 may then be selectively removed starting at face 50b of the PET substrate 50, by an UV excimer pulse laser 20 in a similar manner to the previous examples. The direction of the laser illumination is indicated by the arrow 55 in FIG. 9c. The pulse laser 20 selectively removes the PET material from the PET substrate 50 in a region starting from face 50b corresponding to the bond pad region where electrical connectors 52 are grouped together on face 50a of the PET substrate 50.

Figure 9D:
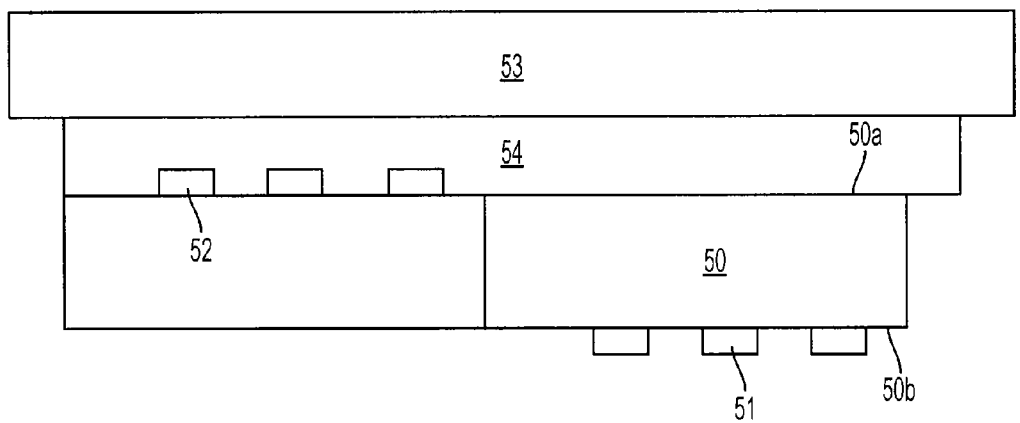
Figure 9E:
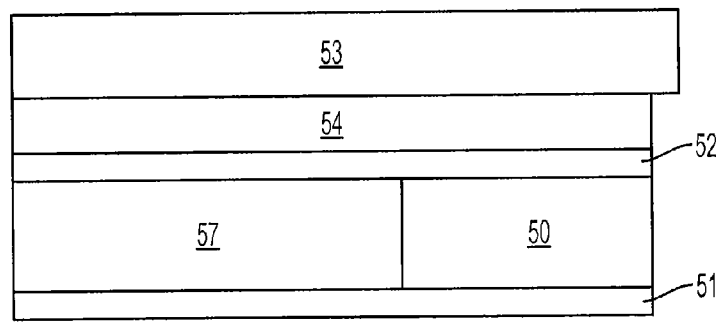
FIG. 9e is a side view of the connector section of the PET substrate of FIG. 9d.

As shown in an exemplary end view in FIG. 9d and in an exemplary side view in FIG. 9e, the pulse laser 20 may be used to selectively remove the PET substrate 50 underlying electrical connectors 52 on the PET substrate 50 in a region 57 so that the rear surfaces of electrical connectors 52, that is, the surfaces of electrical connectors 52 originally facing the PET substrate 50, may be exposed and accessible from the direction of the opposite face 50b of the PET substrate 50. The pulse laser 20 may be controlled to remove PET material in a similar manner to that explained previous examples.

After the PET material of the PET substrate 500 has been removed, electrical connectors 52 may be attached to and supported by the layer of optically clear adhesive 54.

Figure 9F:
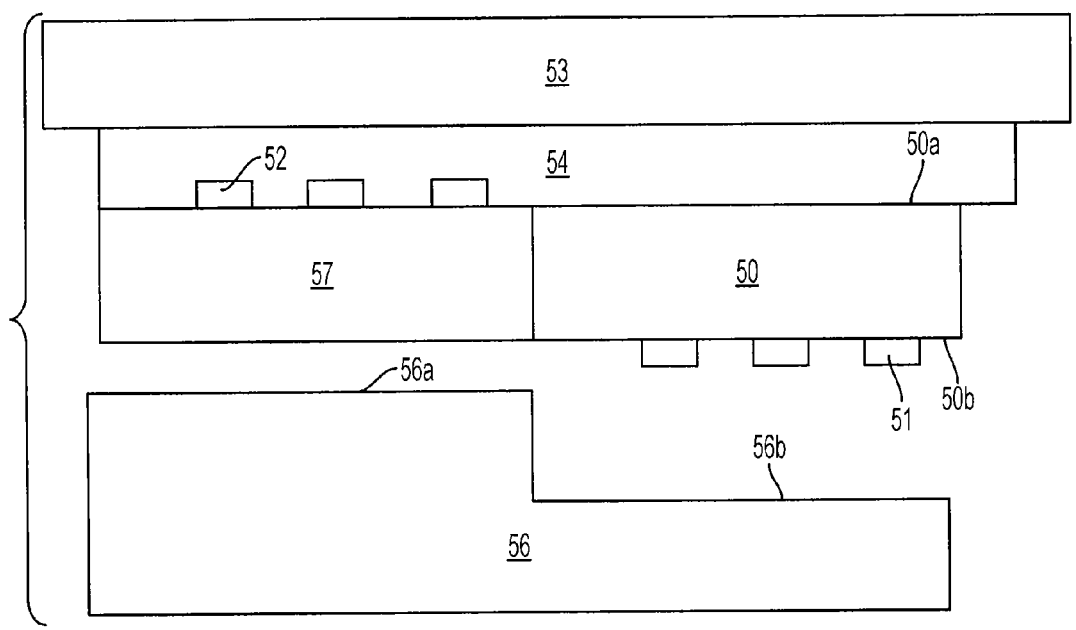
Figure 10A:
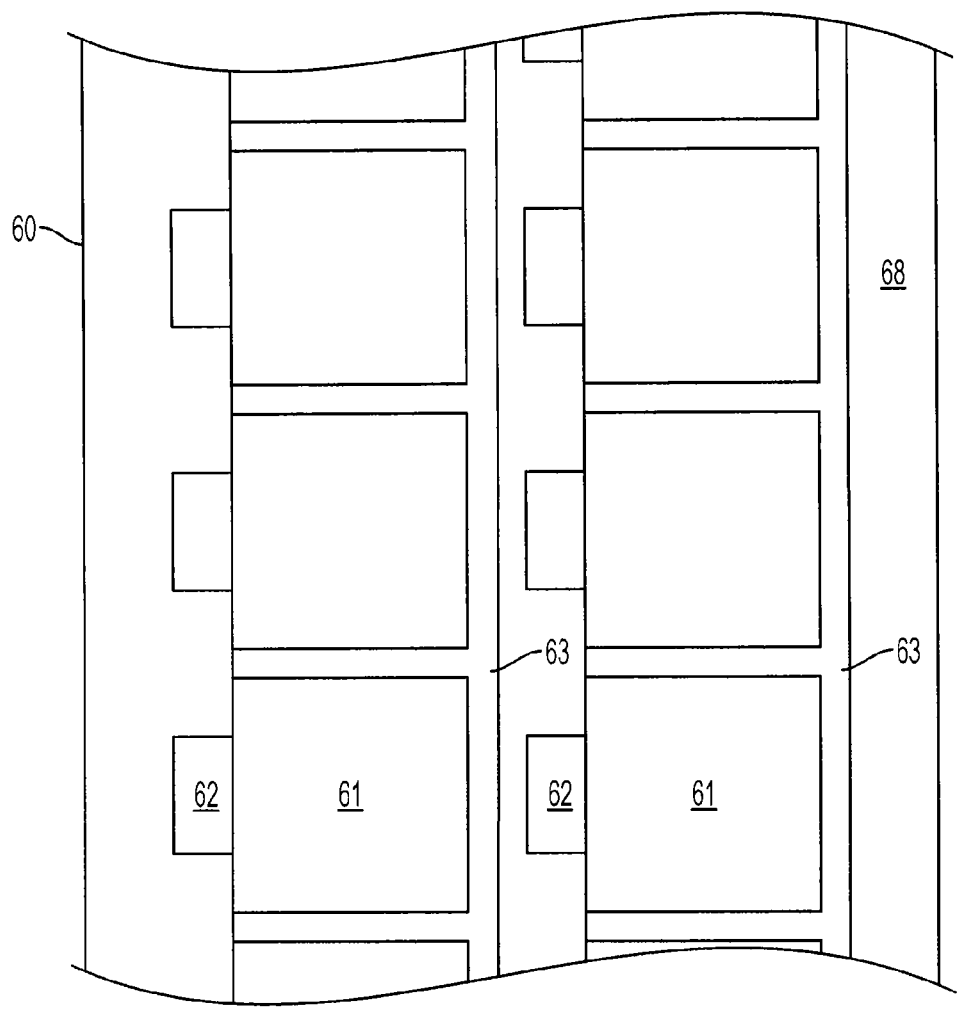
FIG. 10a illustrates schematically a plan view of a stage of an example of producing PET substrates.
Figure 10B:
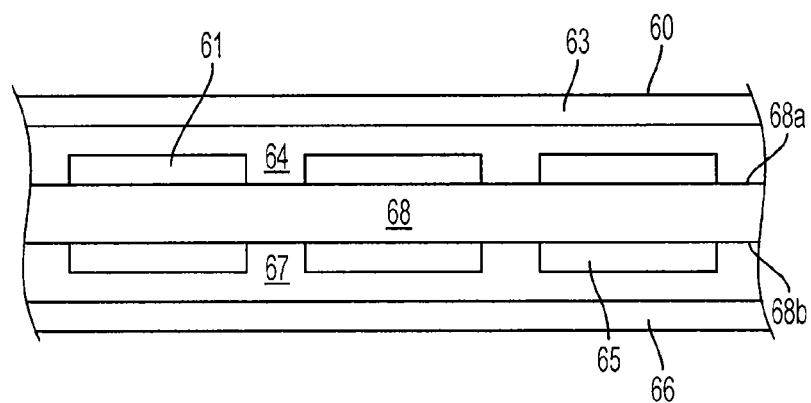

As shown in an exemplary end view in FIG. 9f, a single sided FPC connector 56 may be used to electrically connect to both electrical connectors 52 and electrical connectors 51 from the same direction. The exposed electrical connectors 52 may be embedded in the surface of the layer of optically clear adhesive 54 in the bond pad region at a position corresponding to face 50a of the PET substrate 50, although as explained above, the PET substrate 50 may have been selectively removed where electrical connectors 52 are exposed so that the PET substrate 50 is in fact not present in the region 57. The electrical connectors 51 may be on face 50b of the PET substrate 50 in the bond pad region. The exposed electrical connectors 52 and electrical connectors 51 may be separated in height by the thickness of the PET substrate 50. Accordingly, the connector 56 may have a connection part 56a at one height and a connection part 56b at a different height. The heights of connection parts 56a and 56b of the connector 56 may be separated by the thickness of the PET substrate 50. When the connector 56 is moved into contact with the PET substrate 50 from the direction of face 50a of the PET substrate 50, the connection part 56a may contact electrical connectors 52 at a similar time as the connection part 56b contacts electrical connectors 51. If electrical connectors 52 are not attached to and supported by the layer of optically clear adhesive 54 they may be too fragile for a reliable connection to be made.

In some examples, the connector 56 can be bonded to the PET substrate 50 to form a permanent physical and electrical connection. In one example this may be done by placing an anisotropic conductive film (ACF) between the connector 56 and the PET substrate 50 and applying heat and pressure to carry out a hot bonding process.

In some examples, the PET substrate may be kept straight without any kinked section, resulting in a better seal between the PET substrate and the optically clear adhesive layer, thereby protecting the PET substrate from environmental damage, such as water ingress. Straight PET substrates may also reduce thermal discontinuities, which may reduce temperature differentials between different locations across the PET substrate during a heat and pressure bonding process. Straightness of PET substrates may reduce any risk of damage to the PET substrate and may avoid any part of a connector extending between the PET substrate and a transparent covering sheet. A straight PET substrate may allow for reduced thickness of an optically clear adhesive layer between the PET substrate and cover sheet. This may improve the optical properties of a touch sensitive display device.

An example of a PET substrate and a method of forming the PET substrate are illustrated in FIGS. 11a to 12d.

Figure 11A:
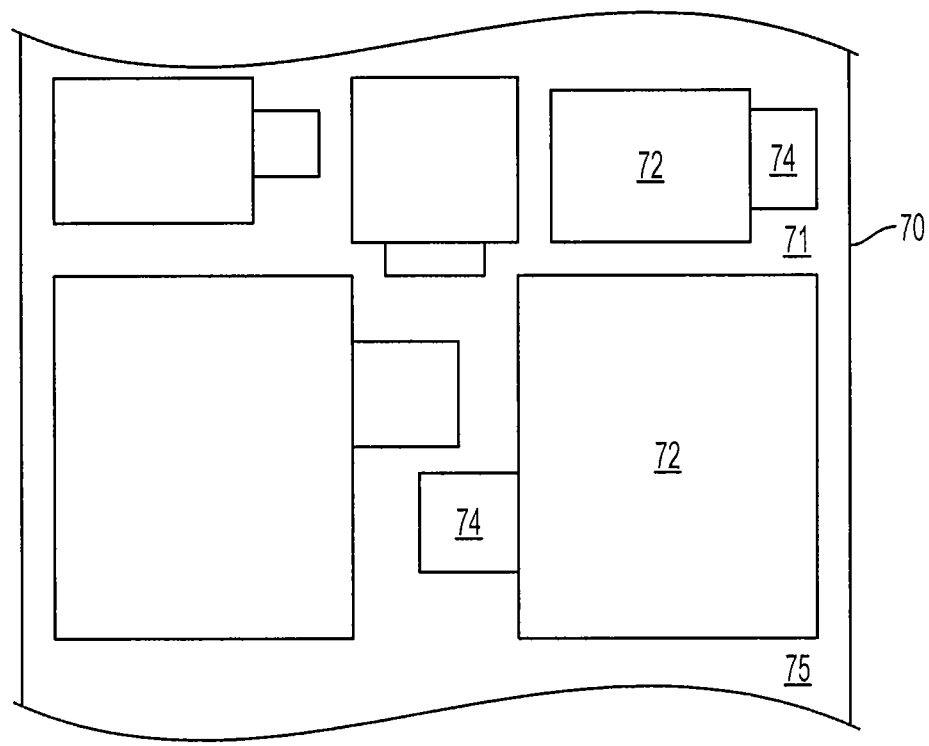
FIG. 11a is a plan view of a stage of forming a PET substrate.
Figure 11B:
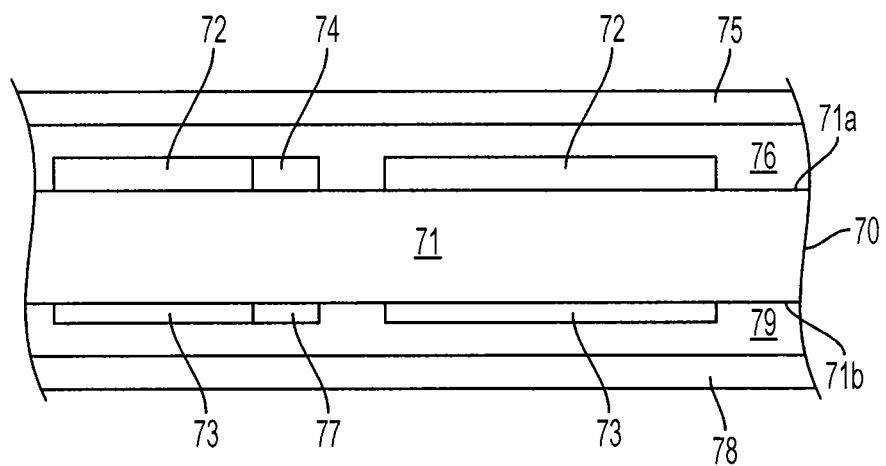

FIGS. 11a and 11b illustrate a plan view and a side view respectively of a laminated sheet 70. The laminated sheet 70 may have a PET sheet 71 forming a core of the laminated sheet 70. The PET sheet 71 may have opposite faces 71a and 71b. The PET sheet 71 may have a number of conductive patterns 72 on face 71a of the PET sheet 71. The PET sheet 71 may have a number of conductive patterns 73 on opposite face 71b of the PET sheet 71. Each of the conductive patterns 72 may be located at a position on face 71a of the PET sheet 71 corresponding to a position on opposite face 71b of the PET sheet 71 of one of the conductive patterns 73. Each of the conductive patterns 72 may define the electrodes and associated conductors required on face 71a of a PET substrate of a touch position-sensing panel. Each of the conductive patterns 73 may define the electrodes and associated conductors required on opposite face 71b of a PET substrate of a touch position-sensing panel. Each of the conductive patterns 72 may include a respective bond pad 74 where electrodes intended to be used to connect conductive pattern 72 to external circuits may be grouped together. Each of the conductive patterns 73 may include a respective bond pad 77 where electrodes intended to be used to connect conductive pattern 73 to external circuits may be grouped together. A transparent PET covering sheet 75 may overlay all of the conductive patterns 72 on face 71a of the PET sheet 71. The transparent PET covering sheet 75 may be secured to face 71a of the PET sheet 71 by an adhesive layer 76 of optically clear adhesive. A transparent PET covering sheet 78 may overlay all of the conductive patterns 73 on face 71b of the PET sheet 71. The transparent PET covering sheet 78 may be secured to face 71b of the PET sheet 71 by an adhesive layer 79 of optically clear adhesive.

The illustrated laminated sheet 70 may be formed by a continuous reel to reel process in which a continuous PET sheet 71 bearing conductive patterns 72 and 73 passes between the transparent covering sheets 75 and 78 bearing the respective adhesive layers 76 and 79. The transparent covering sheets 75 and 78 may be adhered to the respective opposite faces 71a and 71b of the PET sheet 71 by the respective adhesive layers 76 and 79 to form the laminated sheet 70. The laminated sheet 70 may be rolled onto a reel for storage.

FIGS. 12a to 12d illustrate an example of processing of a PET substrate 80 for use in a touch position-sensing panel. The PET substrate 80 is a section of the laminated sheet 70 having a single conductive pattern 72 and a single conductive pattern 73. In one example the PET substrate 80 may be cut from the laminated sheet 70. In some examples, the laser may be used to expose the bond pad area during the roll to roll process before singulation, as this is the easiest point for registration of the laser to the bond bad area.

Figure 12A:
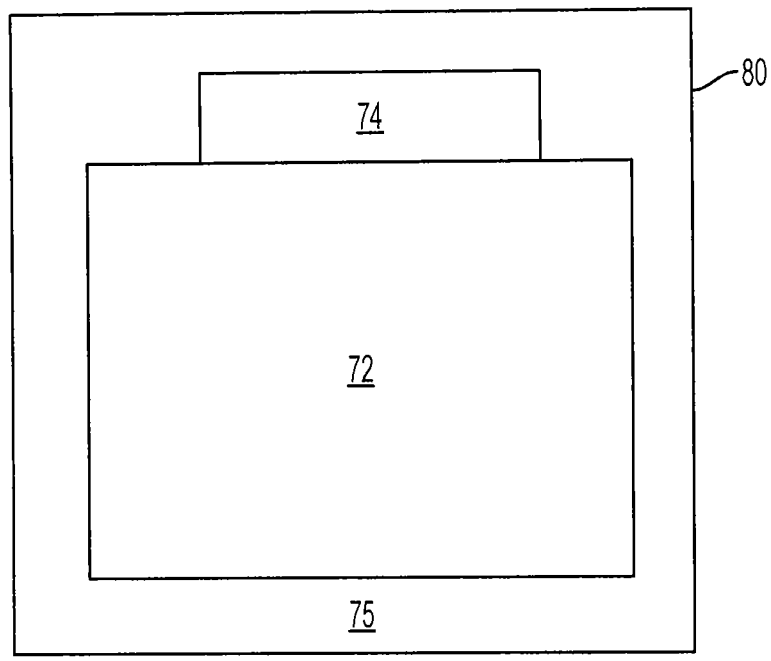
Figure 12B:
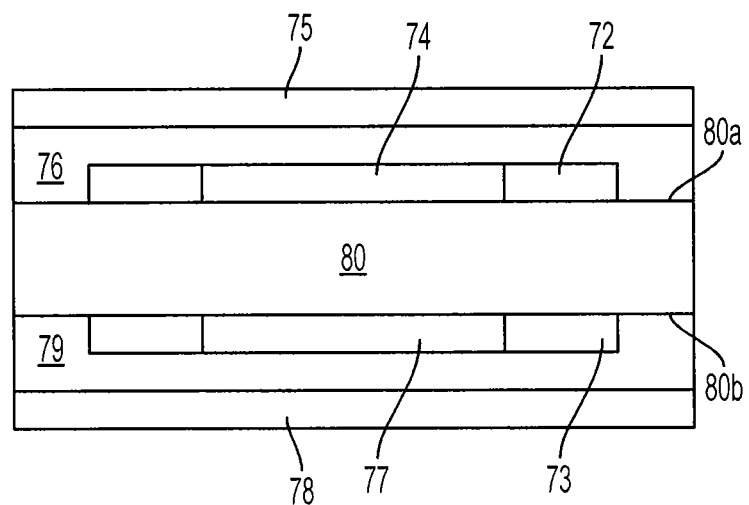

FIGS. 12a and 12b are a plan view and a side view respectively of a PET substrate 80. The PET substrate 80 may have opposite faces 80a and 80b. The PET substrate 80 may have a conductive pattern 72 on face 80a of the PET substrate 80. The PET substrate may have conductive pattern 73 on face 80b of the PET substrate 80. A transparent covering sheet 75 may be attached to face 80a of the PET substrate 80 by a adhesive layer 76. A transparent covering sheet 78 may be attached to the opposite face 80b of the PET substrate 80 by adhesive layer 79.

In one example, the conductive patterns 72 and 73 may be wholly encapsulated by the transparent covering sheets 75 and 78 and the adhesive layers 76 and 79.

Figure 12C:
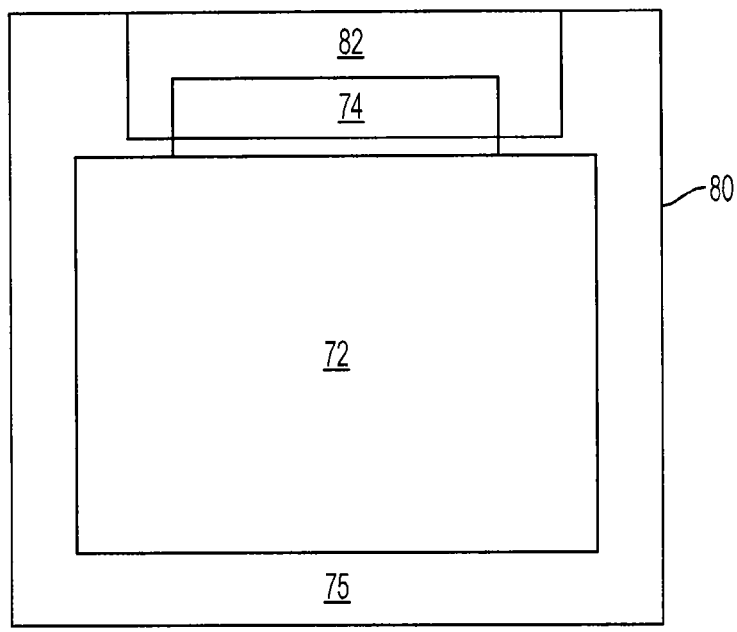
Figure 12D:
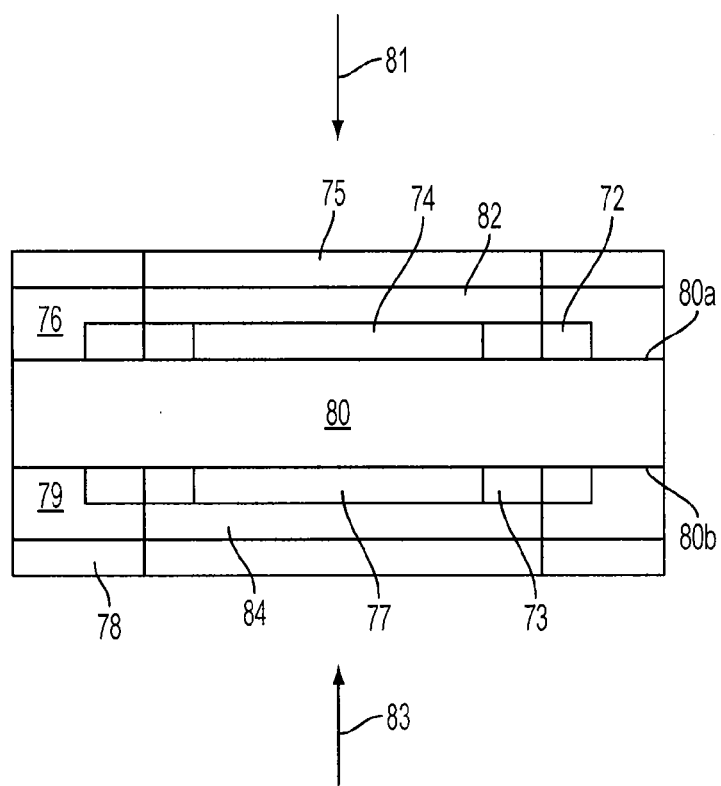
FIG. 12d is a side view of the stage of forming a PET substrate of FIG. 12c.

FIGS. 12c and 12d are a plan view and a side view respectively of the PET substrate 80 of FIGS. 12a and 12b. In the example illustrated in FIGS. 12c and 12d, a pulsed laser 20, such as that shown in FIG. 4, may be used to selectively remove material from the transparent PET covering sheets 75 and 78 and adhesive layers 76 and 79. A laser illuminating from a direction generally indicated by an arrow 81 may be used to selectively remove the transparent PET covering sheet 75 and substantially all of the adhesive layer 76 in a region 82 overlying the bond pad 74. A laser illuminating from a direction indicated by an arrow 83 may be used to selectively remove the transparent PET covering sheet 78 and substantially all of adhesive layer 79 in a region 84 overlying the bond pad 77.

The exposed bond pads 74 and 77 can be used to connect circuits on the PET substrate 80 with external circuits, as explained with respect to earlier examples.

In one example the laser illumination from the different directions may be provided sequentially by a single laser. In other examples, the laser illumination from the different directions may be provided simultaneously by two separate lasers. A laser may be arranged similarly to the pulse laser 20 as shown in FIG. 4.

In the illustrated example, substantially all of the adhesive layers 76 and 79 may be removed. In some examples it may not be necessary to remove the adhesive layers 76 and 79, as the adhesive layers may be located between contact conductors of bond pads 74 and 77.

The illustrated example may allow encapsulation of the fragile copper contacts of the bond pads 74, 77. This may allow the risk of physical and/or environmental damage to the contacts to be reduced. In the illustrated example, the conductive patterns can be distributed across the PET sheet 80 without having to be aligned with one another or with edges of the transparent covering sheets. This may allow more freedom in the arrangement of the conductive patterns, and may allow PET substrates of different sizes to be produced from a single PET sheet. In some examples, more PET substrates may be produced from a specified area of PET sheet. In other examples, accurate aligning of the edges of the transparent covering sheets is possible.

In one example, a single substrate may be separated from the laminated sheet before the laser is used to remove material from the substrate. In other examples the laser could be used to remove material from a number of linked substrates before the substrates are separated from one another and/or from the laminated sheet.

Some examples may have a transparent PET covering sheet and adhesive layer on each side of the PET substrate. In other examples, a covering sheet and adhesive layer may be attached on one side of the substrate. In other examples, a transparent covering sheet of other material may be used. In other examples, an adhesive layer may be used to encapsulate the PET substrate.

Figure 13A:
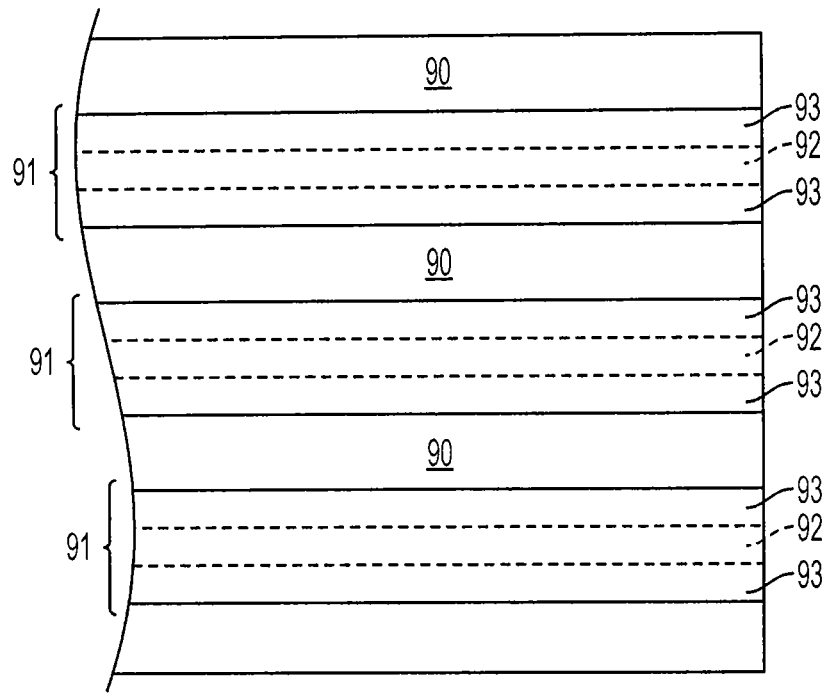
FIG. 13a is a plan view of a stage of forming a bond pad of a PET substrate.
Figure 13B:
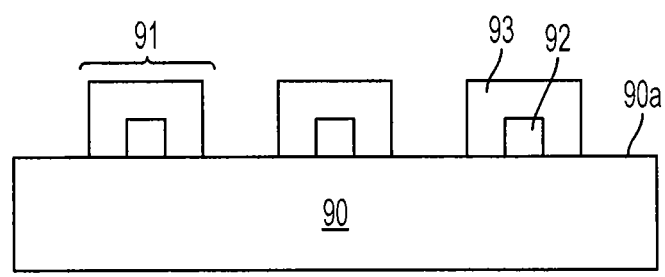

An example of a stage in the manufacture of a touch position-sensing panel is illustrated in FIGS. 13a and 13b, which show a plan view and an end view respectively of a bond pad part of a PET substrate for use in a touch position-sensing panel.

The PET substrate 90 may have a face 90a and a bond pad 91 may be defined on the face 90a of the PET substrate 90. The bond pad 91 may be formed by a number of spaced apart copper conductors 92 on the face 90a of the PET substrate 90. In one example, the copper conductors 92 may have a thickness in the range 1 μm to 2 μm.

Each copper conductor 92 may be covered by a layer of conductive carbon material 93. The carbon material 93 encapsulates the copper conductors 92 to protect the copper conductors 92 from physical and environmental damage, such as oxidation.

In order to link a connector to the bond pad 91 and make electrical connections to the copper conductors 92 the connector may be arranged to contact the conductive carbon material 93 encapsulating each of the copper conductors in order to form an electrical connection through the conductive carbon material to the respective copper conductor 92.

The conductive carbon material 93 may be applied over the copper conductors 92 by screen printing a printable carbon ink. The printed carbon ink may be cured to form the layers of conductive carbon material 93.

FIGS. 14a to 14d illustrate processing of a bond pad part of a PET substrate for use in a touch position-sensing panel according to a further example.

Figure 14A:
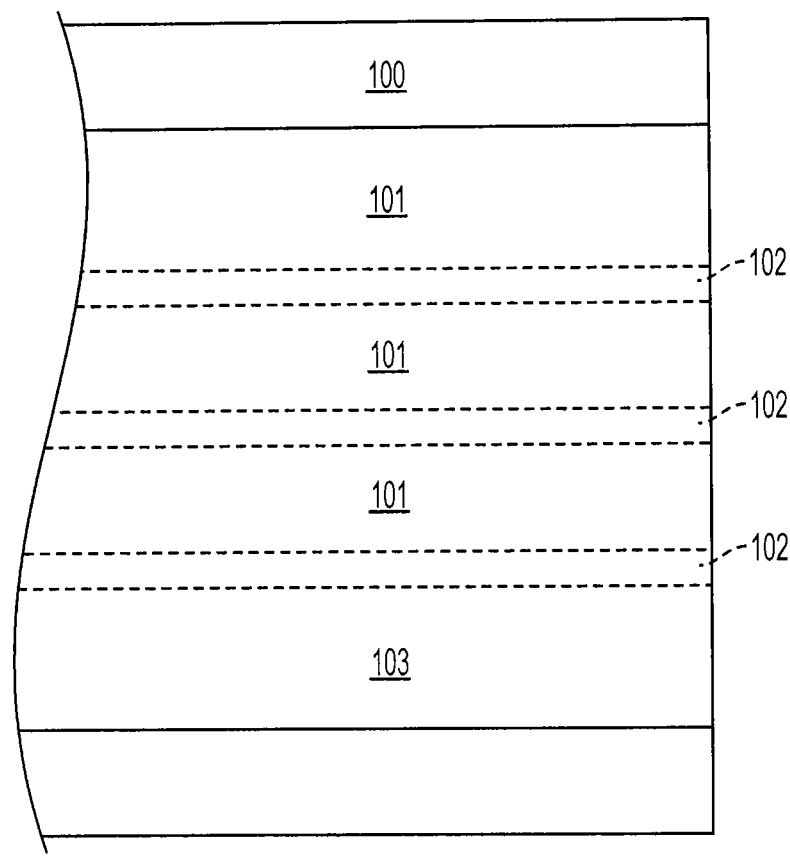
FIG. 14a is a plan view of a stage of forming a bond pad of a PET substrate.
Figure 14B:
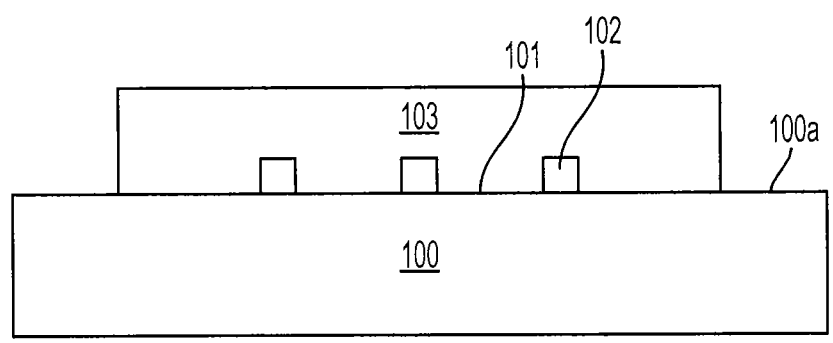

FIGS. 14a and 14b are a plan view and an end view respectively of a bond pad part of a PET substrate 100 for use in a touch position-sensing panel. The PET substrate 100 may have a face 100a and a bond pad area 101 is defined on the face 100a of the PET substrate 100. The bond pad area 101 is formed by a number of spaced apart copper conductors 102 on the face 100a of the PET substrate 100. A continuous layer of conductive carbon material 103 extends across the bond pad area 101 covering all of the copper conductors 102, which are shown by dotted lines.

In the illustrated example of FIGS. 14a and 14b the continuous layer 103 of conductive carbon material can be formed by flooding the bond pad area 101 with a printable carbon ink. The printed carbon ink is then cured to form the continuous layer 103 of conductive carbon material.

Figure 14C:
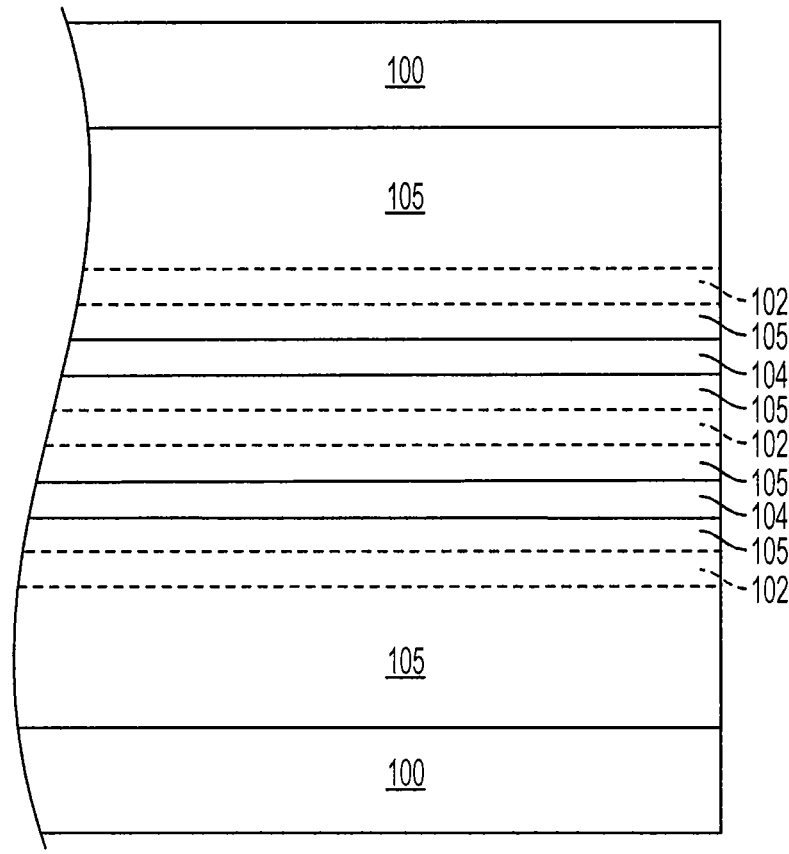
Figure 14D:
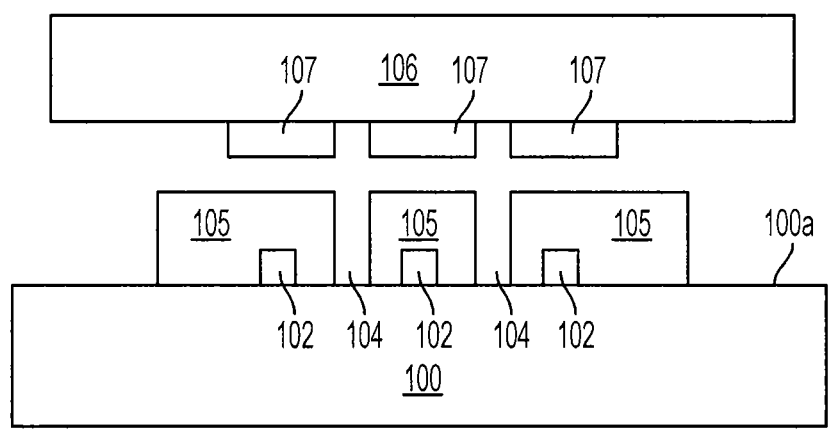
FIG. 14d is a side view of the stage of forming a bond pad of a PET substrate of FIG. 14c.

In the illustrated example, the continuous layer 103 of conductive carbon material is then processed using a pulse laser to selectively remove conductive carbon material from predetermined parts of the bond pad area 101. As shown in FIGS. 14c and 14d, a pulse laser may remove the conductive carbon material along linear regions spaced between adjacent copper conductors 102 in order to form channels 104 extending through the conductive carbon material between adjacent copper conductors 102. The channels 104 may divide the layer 103 of conductive carbon material (FIGS. 14a, 14b) into a number of discrete conductive carbon material sections 105 (FIGS. 14c, 14d) and may electrically separate the different copper conductors 102. Each discrete conductive carbon material section 105 may encapsulate a different one of the copper conductors 102.

As shown in FIG. 14d, a connector 106 having a number of connection pads 107 may be brought into contact with the bond pad area 101 so that each of the connection pads 107 contacts a respective discrete conductive carbon material section 105. Accordingly, the connector 106 may form electrical connections between connection pads 107 and respective copper conductors 102. In one example the connector 106 may be a ZIF connector. In one example the connector 106 may be a 0.5 mm or smaller ZIF connector. In one example the copper conductors 102 may have a thickness in the range 1 μm to 2 μm. The pulse laser may be arranged similarly to the pulse laser 20 according to the earlier illustrated examples.

The illustrated examples of FIGS. 14a-14d may avoid misalignment in screen printing the printable carbon ink which may leave parts of the copper conductors exposed and not encapsulated. The illustrated example may prevent unintended contacts between parts of the conductive carbon material, thereby reducing short circuits between adjacent copper conductors. The illustrated example may allow the encapsulated copper conductors to be more closely spaced. Where a ZIF connector is used to connect to the bond pad, the illustrated example may allow a smaller ZIF connector to be used.

The illustrated examples described above relate to different elements of a PET substrate for use in a touch position-sensing panel. The different illustrated examples may be combined together. For example, the illustrated examples of FIGS. 3a to 3f and the illustrated example of FIGS. 14a to 14d may be combined. In another example, the illustrated example of FIGS. 6a to 7 when using printable carbon ink and the illustrated example of FIGS. 14a to 14d may be combined and the printable carbon ink of both illustrated examples may be printed and cured together.

The illustrated examples described above relate to substrates and related products and components of PET. However, other materials may be used. For example, other polycarbonates, or other light-transmitting polymeric materials suitable for use as a substrate may be used in place of one or more PET elements in any of the examples.

The illustrated examples described above relate to conductor elements and patterns of copper. However, other material may be used. For example, other metals suitable for use as wire pattern material.

The illustrated examples described above relate to substrates and related components for touch position-sensing panels. However, the substrates and related components may be used for other products, such as RFID tags. In examples where the substrates and related components are to be used in products where transparency is not required, the transparent materials used in the illustrated examples may be replaced with opaque equivalents. For example, the optically clear adhesive may be replaced by an opaque adhesive.

The substrates discussed above may also be incorporated into devices using a self-capacitance drive approach.

Various modifications may be made to the examples described in the foregoing, and any related examples may be applied in numerous applications, some of which have been described herein. It is intended by the following claims to claim any and all applications, modifications and variations that fall within the true scope of the present disclosure.

What is claimed is:

1. An electrical component comprising:
   an insulating substrate having a first face and a second face opposite the first face;
   a plurality of first electrodes formed entirely on the first face of the substrate;
   a plurality of conductive tracks on the first face, the plurality of conductive tracks adapted to connect the plurality of first electrodes to external circuitry;
   a first conductive pattern of a touch position-sensing panel on the first face, the first conductive pattern having a rear surface facing the insulating substrate and a front surface opposite the rear surface, the first conductive pattern adapted to electronically couple to the external circuitry;
   a second conductive pattern of the touch position-sensing panel on the second face, the second conductive pattern comprising at least in part a plurality of second electrodes formed entirely on the second face of the substrate, the plurality of first electrodes on the first face configured to capacitively couple to corresponding electrodes of the plurality of second electrodes on the second face;
   a recess passing through the insulating substrate to the first and second faces of the insulating substrate; and
   a conductive material located within the recess and forming a conductive connection between the first and second conductive patterns, the conductive connection electronically coupling at least one of the plurality of second electrodes to at least a portion of the first conductive pattern for connecting the at least one of the plurality of second electrodes to the external circuitry via the at least a portion of the first conductive pattern on the first face.

2. The electrical component of claim 1, wherein a surface of the conductive material is parallel with the plane of the first conductive pattern.

3. The electrical component of claim 1, wherein the conductive material is at least one material selected from the group consisting of: solder, silverloaded epoxy and printable carbon ink.

4. The electrical component of claim 1, wherein the substrate is comprised of one material selected from the group consisting of: polycarbonate and polyethylene terephthalate.

5. The electrical component of claim 1, wherein the plurality of conductive tracks is a plurality of first conductive tracks and the electrical component further comprises a plurality of second conductive tracks extending across the second face of the insulating substrate, the plurality of second conductive tracks adapted to connect the second conductive pattern to circuitry.

6. The electrical component of claim 1, wherein the conductive material extends through the opening of the second conductive pattern such that the conductive material extends over and contacts at least some of a front surface of the second conductive pattern, the front surface of the second conductive pattern facing away from the insulating substrate.

* * * * *